United States Patent [19]

Brooks et al.

[11] Patent Number: 5,111,402
[45] Date of Patent: May 5, 1992

[54] INTEGRATED AIRCRAFT TEST SYSTEM

[75] Inventors: David K. Brooks, Seattle; Cindy M. Waun, Kirkland; Larry E. Gross, Issaquah, all of Wash.

[73] Assignee: Boeing Company, Seattle, Wash.

[21] Appl. No.: 467,772

[22] Filed: Jan. 19, 1990

[51] Int. Cl.$^5$ ...................... G06F 15/20; G01M 19/00
[52] U.S. Cl. ..................... 364/424.04; 364/424.03; 324/73.1; 371/15.1; 371/25.1
[58] Field of Search .............. 364/424.01, 424.03, 364/424.04, 431.01, 578, 579, 580, 550, 551.01; 324/73.1; 371/15.1, 25.1, 26, 27, 71; 73/117.2

[56] References Cited

U.S. PATENT DOCUMENTS

| | | | |
|---|---|---|---|
| 4,055,801 | 10/1977 | Pike et al. | 371/25.1 |
| 4,454,588 | 6/1984 | O'Brien | 364/579 |
| 4,626,996 | 12/1986 | Arlott | 364/550 |
| 4,779,220 | 1/1989 | Nielsen | 371/25.1 |
| 4,821,217 | 4/1989 | Jackson et al. | 364/551.01 |
| 4,841,456 | 6/1989 | Hogan, Jr. et al. | 371/25.1 |

*Primary Examiner*—Gary Chin
*Attorney, Agent, or Firm*—Christensen, O'Connor, Johnson & Kindness

[57] ABSTRACT

An integrated aircraft system for funtionally testing the components and subsystems of an aircraft during its manufacture and subsequent maintenance. A central control unit serves as a repository for test applications and instruction sets that comprise the individual steps of the functional tests performed on the aircraft. In response to receiving indications of work performed on the aircraft, the central control unit displays an indication of the functional tests that should be performed on the aircraft. The system includes a plurality of automated test equipment carts (ATEs). Each of the ATEs contains a number of processor-controllable instruments for performing functional tests on specific components and subsystems that comprise a specific aircraft system. A system controller on each of the ATEs controls the operation of the test instruments associated therewith. The system controllers are also capable of directing the broadcast of simulation data to aircraft components so that the response of the components to the stimulation data can be tested. Test application from the central control unit are run on the system controller of each ATE contain instructions that direct the system controller to perform specific functional tests on the aircraft using test instruments and to store the test results in a system controller memory associated therewith. The ATEs are selectiively connected to the central control unit having a main memory so that the test results results stored in the system controller memory may be unloaded and permanently archieved. A remote access terminal also connectable to the central control unit is also provided so that personnel can receive instructions for manual tests and be provided with a means for entering the test results into the system. The central control unit reviews the results of the functional tests performed on the aircraft and broadcasts appropriate messages if functional tests were missed or failed, or the aircraft passed functional testing.

39 Claims, 12 Drawing Sheets

INTEGRATED AIRCRAFT TEST SYSTEM

FIELD OF THE INVENTION

This application relates generally to aircraft manufacturing and maintenance test systems and, more specifically, to an integrated test system for testing a number of different aircraft systems.

BACKGROUND OF THE INVENTION

Functional testing is an integral part of aircraft manufacturing and maintenance processes which ensures that the aircraft systems operate properly so that an aircraft can be flown safely. Functional testing of modern commercial and military aircraft is performed on most, if not all of the components in each aircraft system. During functional testing, components are tested separately and/or as an integral part of a subsystem to ensure that the components and the subsystems will function as intended. Proper testing of individual components and subsystems often requires that each component or subsystem be tested in different modes for response to different external conditions. For example, thorough testing of an aircraft flight control subsystem may require testing of the subsystem in conditions that simulate fully and partially operative, and inoperative states of a hydraulic system that moves the flight control surfaces. Thus, aircraft subsystem functional testing often requires a large number of tests that are redundant except for variations in conditions external to the tested component or the subsystem. Accordingly, aircraft functional testing demands the running of a large number of test procedures, many of which include a large number of test steps.

The number, complexity, and exactness of the required test procedures have made aircraft functional testing a difficult, time-consuming activity. Moreover, when an aircraft is being assembled, efficiency often demands that each component or subsystem be tested soon after the component or subsystem is installed in the aircraft. Immediate testing makes it possible to repair or replace a malfunctioning component before later assembly complicates access to the component. Often though, components that provide stimulus to a newly installed component to be tested, or that respond to output signals therefrom, are not operative or even installed in the aircraft when it is desirable to test the newly installed component. The inoperativeness of the complementary components makes testing of newly installed components a difficult, if not impossible, task.

Other difficulties are associated with the level of support required to perform the necessary testing procedures. Technicians must know the different tests that need to be performed on each aircraft component and how to operate the complicated equipment needed to perform the tests. Whenever the testing procedures for an aircraft, or a particular component thereof, change, the technicians are required to learn the new testing procedures. Moreover, given the number of test procedures that need to be performed, and the slight variation between some of the procedures, there is a distinct possibility that even the most conscientious technician may improperly perform a given test. Improper testing of an aircraft component that may affect the safe operation of the aircraft should clearly not occur.

The scheduling of functional tests that need to be performed during the aircraft manufacture and maintenance processes adds to the complexity of these processes. In many aircraft manufacturing environments, personnel who assemble aircraft are not the personnel who do the testing. Consequently, test personnel must rely on written records completed by the assemblers to know when components and subsystems have been installed in the aircraft so that they can be tested. In aircraft maintenance environments, some functional tests need to be performed each time a component is repaired or replaced, other tests need to be performed periodically based on the number of hours the aircraft has been in flight, while still other functional tests must be periodically performed based on how many segments the aircraft has flown (i.e., the number of takeoffs and landings the aircraft has made). Maintenance personnel performing the tests need to review numerous records to determine what tests need to be performed on an aircraft. All this review of records during the aircraft manufacture and maintenance processes adds to the time required to perform the tests. Moreover, the scheduling process requires that manufacturing and maintenance personnel make records that accurately reflect work done on an aircraft, and that test personnel thoroughly review the records and, upon the basis of the review, correctly determine the functional tests that need to be performed on the aircraft.

Aircraft functional testing also requires that component test records be maintained for review by regulatory agencies. Test records are generated and maintained so that the agencies can verify that the components have been tested to ensure that they operate properly. Maintenance personnel also find access to component test result histories helpful. Test records may, for example, show that different types of navigation computers installed in a particular aircraft frequently fail a certain test. Maintenance personnel reviewing the test records for the navigation computers can then use the information therein as a basis upon which to conclude that the faults may not be with the computers, but with one or more of the components connected to them. Accordingly, it is desirable, if not mandatory, to keep a record of the manufacturing and post-manufacturing maintenance functional tests run on an aircraft.

The record keeping that is required for each functional test adds to the complexities of the aircraft testing process. Proper record keeping requires that the result of each test be recorded as soon as the results are known. This step increases the overall time it takes to perform each test. Paper record keeping of test results requires large numbers of records, in the form of test report sheets, to accompany an aircraft as it is subjected to manufacturing and maintenance testing. Filing and maintaining test report sheets and any reduction of data thereof are time-consuming tasks that add to the overall cost of the testing. Furthermore, proper record keeping requires that the results of each test procedure be accurately recorded, and that other transcribing the original record make true copies of same. Each of these steps involve human activity, which means that there is the possibility that human error will result in inaccurate test record results being created and maintained.

Stand-alone test devices have been developed for the automated testing of some aircraft components and subsystems. These test devices typically are connected to specific ports on the aircraft associated with the particular component or subsystem the device is designed to test. Such test devices, however, do not facilitate the process of performing the large number of different test procedures that are now required to certify that an aircraft is airworthy.

SUMMARY OF THE INVENTION

This invention provides a new and useful integrated aircraft test system for ascertaining the airworthiness of various systems, subsystems, and components of an aircraft. The integrated aircraft testing system of this invention is useful for performing functional tests on various parts of an aircraft, both when the aircraft is being manufactured, and during the subsequent maintenance thereof. The integrated aircraft test system of this invention informs test personnel of what functional tests need to be performed on an aircraft during the manufacture or maintenance thereof. The integrated aircraft testing system of this invention automatically performs many of the functional tests that must be performed on an aircraft with minimal, or no, technician assistance. For the functional tests that must be performed manually, the system provides test personnel with explicit instructions regarding the exact functional test steps that need to be performed. Test results are then recorded and achieved without written transcription by the system as part of the testing process.

The integrated test system of this invention includes a central control unit that contains a schedule of all functional tests that are performed on an aircraft. The schedule for a particular functional test on a given component may, for example, indicate that the component is tested when it is installed, repaired, and replaced after a certain number of aircraft flight hours, or when another component is repaired or replaced. Manufacturing or maintenance personnel use a terminal connected to the central control unit to indicate the work performed on the aircraft. In response to receiving an indication of the work done on the aircraft, the central control unit provides test personnel with an indication of the functional tests that need to be performed on the aircraft.

The integrated aircraft test system of this invention also relies on an on-aircraft central maintenance computer and includes a number of different automated test equipment carts (ATEs). The central maintenance computer is connected to a number of on-aircraft line-replaceable units, each of which functions as an interface to a specific set of sensors, instruments, drive circuits, indicators, and control devices that form the particular aircraft system or subsystem. The line-replaceable units are responsible for receiving aircraft state information and respond to it by broadcasting information to other parts of the aircraft or generating specific commands. The line-replaceable units are also capable of broadcasting test or simulation data to other aircraft components so that the response of the recipient components to the simulation data can be monitored. The central maintenance computer generates test instructions and information to the specific aircraft components through the line-replaceable units. The central maintenance computer also receives data from the aircraft components through the line-replaceable units that broadcast the results of the tests run on the components. The central maintenance computer also receives and stores flight data from the line replaceable units regarding the operation of the aircraft. The data in the central maintenance computer is forwarded to the central control unit which uses the data to determine when specific functional tests need to be performed on the aircraft.

Each ATE includes a number of different test instruments designed to test the airworthiness of specific aircraft components and subsystems. Specifically, there are ATEs for measuring and monitoring the component and subsystems that are associated with the aircraft flight control, avionics, engine, and power systems. A system controller on each ATE runs the test instruments during the functional testing. Each ATE also includes a link for exchanging messages with the central maintenance computer and at least one display-data entry device so as to allow technicians to exchange messages and instructions with the ATE. The individual ATEs each have one or more custom signal interface cables so that the test instruments on the ATE can exchange signals with the appropriate aircraft components.

ATE-specific test applications run on the system controllers control the functional tests performed by each ATE. Each test application contains system controller-executable instructions that direct the ATE to apply specific stimuli to selected aircraft components and direct the ATE to measure and record specific component responses to the stimuli.

Component and subsystem testing using the integrated aircraft test system of this invention is performed by initially connecting the ATE for testing the selected components or subsystems to the aircraft. The technician performing the test then indicates on the display-data entry device the component or subsystem to be tested and the type of tests to be run. In response to the test selection, the system controller invokes a specific test application for execution. The test application contains instructions that cause the ATE to generate appropriate test stimuli to the component or subsystem and to measure the response therefrom. The test application also contains instructions for generating messages on the display-data entry device informing the technician what steps he/she has to perform during the test. The system controller stores test data from the tested component or subsystem in a system controller memory.

The ATEs are also capable of invoking the line replaceable unit simulation packages through the central maintenance computer. The test applications include instructions directing simulation data to be broadcast when it is desirable to test component response to the simulation data. For example, the ATE used for engine system testing transmits information to a selected line replaceable unit that it is to broadcast simulation data that the aircraft is in flight, when in fact, the aircraft is still being assembled. Thus, it is possible to test the "in flight" response of aircraft components and subsystems at any time.

After a test application is run, the technician can select another application for execution by the ATE. After the desired functional tests have been performed, the ATE is disconnected from the aircraft and connected to a central control unit, a main frame computer. The central control unit unloads the test results data from the ATE system controller memory into a main memory. Test results for the aircraft are then available for review from the main memory.

The integrated aircraft test system of this invention also includes a remote access terminal which is a portable touch screen display panel that a test personnel carries with him/her when performing manual test. The remote access terminal has a memory that contains explicit instructions regarding the manual tests the test personnel need to perform. The instructions are presented on the display screen during the course of the manual testing so that the test personnel knows which steps must be performed. The touch screen allows the technician to store the test results directly in the remote access terminal memory. The remote access terminal is selectively connectable to the central control unit so that initially the terminal memory can be loaded with instructions for the next manual test steps that need to be performed on the aircraft. After testing is completed, the test results are automatically downloaded from the terminal memory to the central control unit.

The integrated aircraft test system of this invention automatically informs test personnel of the functional tests that need to be performed during aircraft manufacture and maintenance processes. Since the central control unit informs personnel of the tests that need to be performed in response to the state of the aircraft, personnel do not have to spend time making the same determination. Moreover, since the central control unit keeps a record of the tests performed on an aircraft, it can assert an appropriate indication whenever a test is inadvertently not performed.

The integrated aircraft test system of this invention also makes it possible to efficiently test the large number of components and subsystems that comprise the various systems in a modern aircraft. Each test application is run automatically by an ATE system controller so that there is minimal, if any, technician involvement in the testing process. This automation eliminates the need to teach the technician the individual steps of each test process that has to be performed, and minimizes the possibility that human error could cause a test to be improperly performed. Moreover, some functional test procedures can be performed faster by the ATEs than by the most efficient technicians.

The ability of the system to direct the broadcast of simulation data further enhances the efficiency of the testing process. Aircraft components and subsystems can be thoroughly tested even though other components of the aircraft are not available to provide desired test stimuli. Since the simulation data are broadcast automatically, technician time and error associated with generating the data is eliminated.

The integrated aircraft test system of this invention automatically records the results of the automated and manual test procedures run on each aircraft component and subsystem. This eliminates the need to have a technician record the results of each test procedure, or for others to have to transcribe same. Furthermore, since the test results and records are generated and maintained with only minimal human involvement, the risk that human error will cause incorrect test records to be archived is essentially eliminated.

The automatic record keeping performed by the integrated aircraft test system also eliminates the need and expense of having a paper trail of aircraft component and subsystem test results follow the aircraft during its manufacture and subsequent maintenance. If the test results for a particular aircraft component or subsystem are needed, the results can be readily retrieved for review from the central control unit main memory.

BRIEF DESCRIPTION OF THE DRAWINGS

The invention is defined with particularity in the appended claims. Advantages of the invention may be better understood by referring to the following detailed description, taken in conjunction with the accompanying drawings in which:

DETAILED DESCRIPTION OF PREFERRED EMBODIMENT

Figure 1:
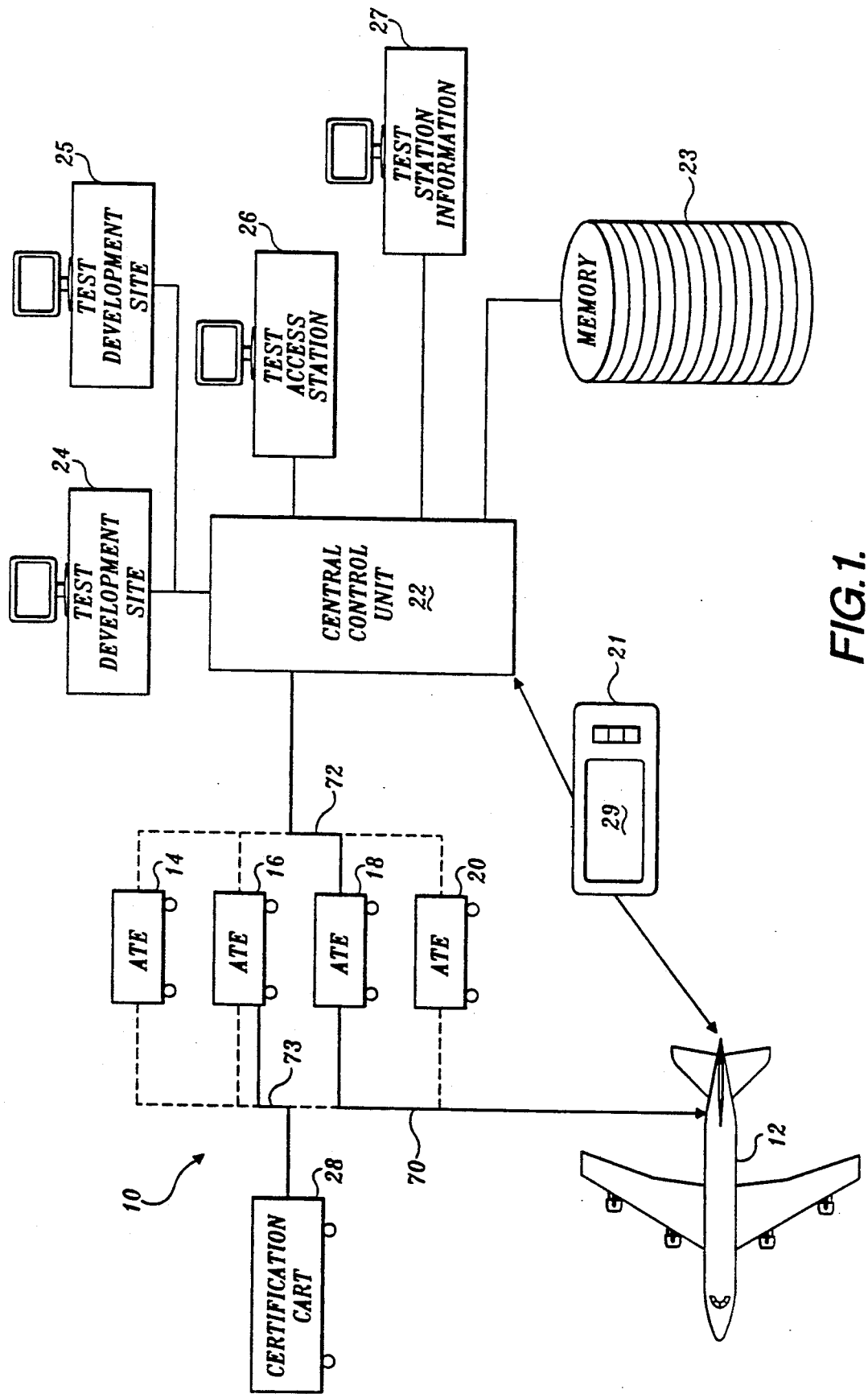
FIG. 1 is a general diagrammatic block diagram of an integrated aircraft test system constructed in accordance with this invention.

FIG. 1 diagrammatically depicts an integrated aircraft test system 10 for performing a variety of manufacturing and maintenance tests on an aircraft 12. The integrated aircraft test system includes a number of portable automated test equipment carts (ATEs) 14, 16, 18, and 20, each of which performs functional tests on specific aircraft 12 components and subsystems. A remote access terminal 21, which is a portable display and data entry unit, provides personnel with instructions for functional tests that are performed manually and a means for recording and storing the results of those tests. Central control unit 22, a main computer, is selectively connected to the ATEs 14–20 and the remote access terminal 21 for loading control programs and information thereto and for retrieving the results of test procedures therefrom. Test procedure data received from the ATEs 14–20 is archived by the central control unit 22 in a permanent memory 23 from which the information can be selectively accessed.

The integrated aircraft test system 10 includes a number of test development sites, represented by terminals 24 and 25, that are connected to the central control unit 22. The test development sites 24 and 25 are used for developing, inspecting, and scheduling the functional tests performed on the aircraft 12. The system 10 also includes test access stations and test information stations connected to the central control unit 22, represented by terminals 26 and 27, respectively. Test access stations 26 are located in manufacturing and maintenance facilities and are used by assembly, maintenance, and test personnel to exchange information with the central control unit 22 about work and tests performed on the aircraft 12. Test information stations 27 are located at remote sites, such as in a production offices, and allow personnel to review the tests performed on the aircraft 12.

Figure 2:
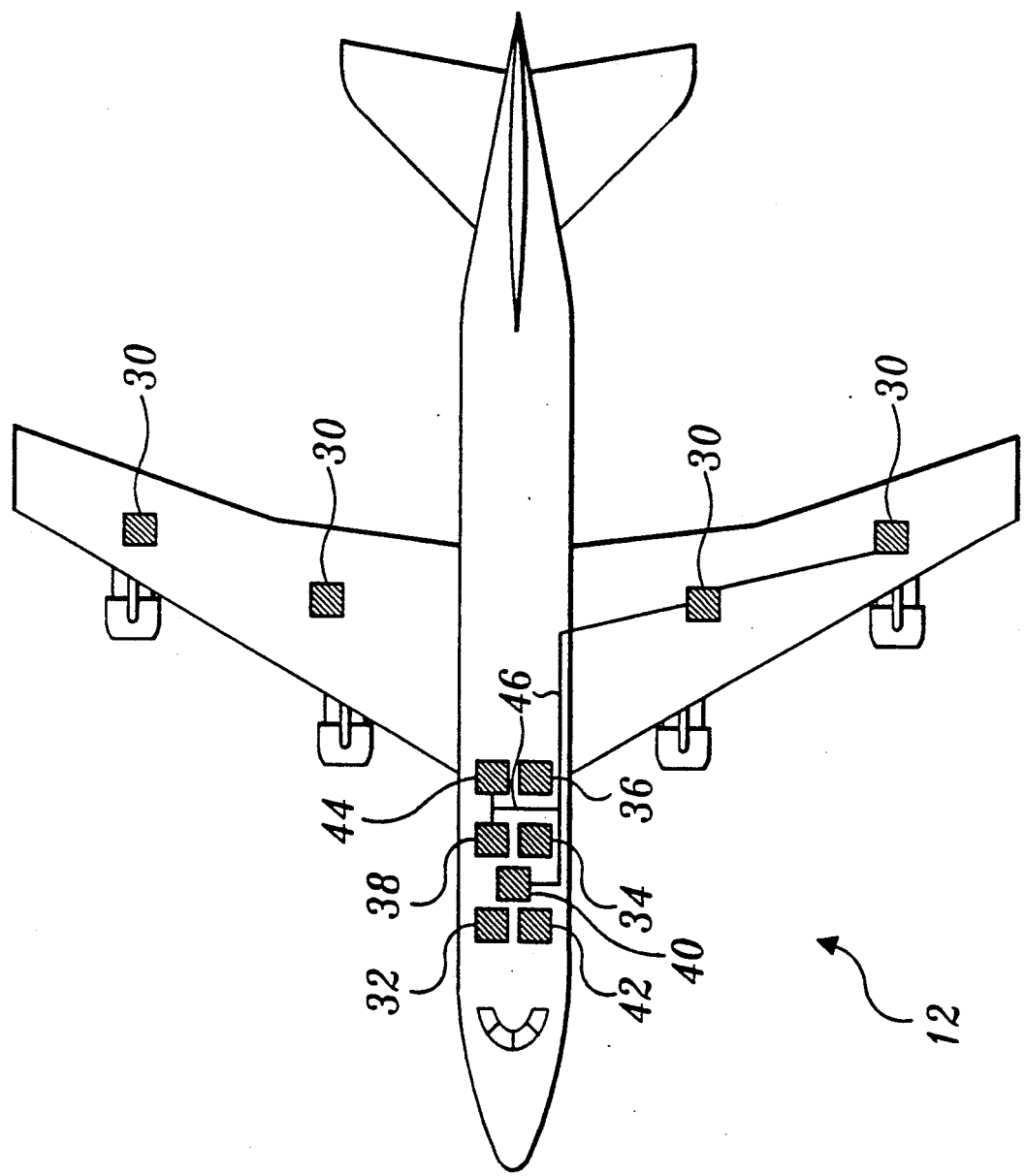
FIG. 2 is a diagrammatic block diagram of the line-replaceable units on board an aircraft.

Aircraft 12, as depicted in FIG. 2, contains a number of line-replaceable units (LRUs) 30-44, each of which is a microprocessor-type control unit for monitoring and-/or controlling specific subsystems and components of the aircraft. Some LRUs, such as LRUs 30-36, monitor or control actual flight control systems of the aircraft. Specifically, electronic engine control (EEC) LRUs 30 are associated with each aircraft engine for monitoring and controlling the operation of the engine. An air data computer (ADC) LRU 32 responds to changes in static and dynamic air pressure by generating signals representative of altitude and air speed of the aircraft 12. A proximity switch electronic unit (PSEU) LRU 34 monitors the status of switches and sensor that provide state information regarding the aircraft 12. The PSEU 34, for example, monitors switches that indicate whether the landing gear is in the extended position such as when the aircraft is on the ground, or whether the gear is in the rotated position inside the aircraft when the aircraft is in flight. A flap control unit (FCU) LRU 36 monitors the status of the flaps on the aircraft, and responds to commands 36 to readjust the flap settings.

Other LRUs, such as LRUs 38-44, are used to control components and subsystems that assist the flight crew during the operation of the aircraft 12 or persons involved in the maintenance of the aircraft. An electronic flight indication system, engine indication and crew alerting system interface unit (EIU) LRU 38 controls the visual annunciators and the light signals in the aircraft that inform the flight crew of the state of various aircraft subsystems. A modular aural warning electronics assembly (MAWEA) LRU 40 controls the audio annunciators that provide the flight crew with an aural information and warnings regarding the aircraft 12. A flight control computer (FCC) LRU 42 serves as the autopilot for the aircraft 12.

An on-aircraft central maintenance computer (CMC) LRU 44 is used to compile maintenance records for the aircraft 12. The CMC 44 compiles aircraft maintenance records by receiving aircraft state information from LRUs 30-42. For example, the CMC 44 receives messages from PSEU 36 indicating how many times the aircraft gears have been rotated and extended; the CMC keeps a count of these movements so technicians can determine when the aircraft 12 landing gear should undergo periodic maintenance inspections. As will be discussed hereinafter, CMC 44 is also used to assist in the testing of the aircraft 12.

During operation of the aircraft 12, each LRU 30-44 broadcasts data to other selected LRUs to which the recipient LRUs respond. The LRUs 30-44 exchange information over a network of buses 46, one represented by lines extending from PSEU 34. Depicted bus 46 is used by the PSEU 34 to exchange information with the LRUs, of which only connections to an EEC 30, EIU 38, and CMC 44 are shown. For example, whenever the aircraft 12 landing gear change between the extended and rotated positions, PSEU 34 transmits a message of the state change to the EIU 38. The EIU 38, upon receiving a message regarding position change of the landing gear, then sets appropriate visual annunciators in the cockpit to indicate the current state of the landing gear.

Figure 3:
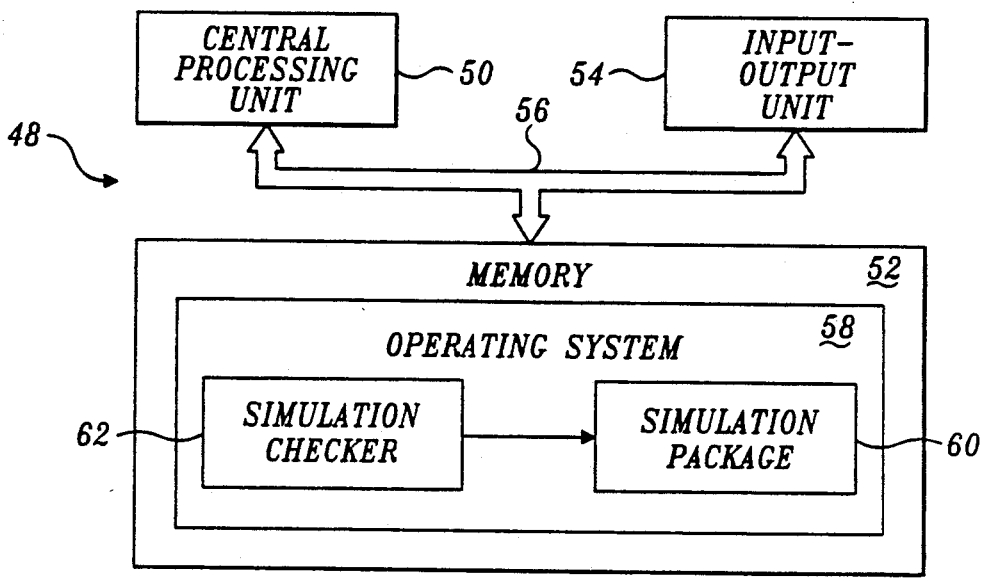
FIG. 3 is a block diagram of the separate elements of a line-replaceable unit control processor and of the programs that control the line-replaceable unit wherein the programs are depicted as modules within the processor.

The depicted LRUs 30-44 each contain at least a rudimentary LRU processor 48, as represented in the block diagram of FIG. 3. LRU processor 48 includes the central processing unit 50 that controls the generation of signals from the LRU in response to input signals and sets of program instructions. A memory 52 is provided for storing instructions used to run the LRU processor 48 and for LRUs 30-44 to store current data. The LRU processor 48 also has a number of input/output units 54, so that the LRU processor can exchange data with other portions of the aircraft. Specifically, the input/output units 54 provide for information exchange with transducers that the LRU monitors, components, and subsystems of the LRU controls, and for data exchange with other LRUs. One or more communication buses 56, only one of which is shown, are connected between the central processing unit 50, the memory 52, and the input/output units 54, and allow for the exchange of information therebetween.

Programs that control the operation of the LRU 48 are depicted as modules inside the LRU processor memory 52. An LRU operating system 58 is the basic control program for each of the LRUs 30-44. The LRU operating system 58 contains executable instructions that respond to transducers, switch and signal states, and data from other LRUs that are supplied to the LRU. The LRU operating system instructions typically comprise commands to components and subsystems that are controlled by the LRU or commands to transmit specific information to other LRUs.

Inside the LRU operating system 58 is a simulation package 60 that is used during the testing of the aircraft 12. Simulation package 60 is used to broadcast false or simulated data from the LRUs 30-44 to which other aircraft components respond. The broadcasts of simulation data make it possible to test the response of recipient components to situations represented by the simulation data. For example, FCU 36 may inhibit flap extension beyond a certain point when the aircraft 12 is on the ground. Simulation program 60 in the PSEU 34 can be invoked to send a simulated landing-gear-up aircraft-in-air message to the FCU 36 so that during ground testing, the full range of the flap extension can be observed. Most simulation packages 60 contain instructions for generating simulation data over the LRU buses 46 to other LRUs 30-44. Some simulation packages 60 also contain simulation packages to generate commands to specific aircraft 12 components under the control of the associated LRU.

Simulation packages 60 are invoked in response to commands from the CMC 44. To prevent simulation packages 60 from being inadvertently invoked, the LRU operating systems 58 are equipped with simulation checkers 62. A simulation checker 62 responds to commands to invoke a simulation package 60 by verifying that the CMC 44 requested the package to be invoked. In one aircraft 12 construction, the CMC 44 grounds selected signal lines (not illustrated) depending on which LRU simulation package 60 is to be invoked. The simulation checker 62 responds to an invoke-simulation-package command by determining if the specific signal lines are open or grounded. If the signal lines are open, simulation checker 62 ignores the command to invoke the simulation package 60. If the signal lines are grounded, simulation checker 62 invokes simulation package 60 so that simulation data can be broadcast. Simulation checker 62 thus prevents simulation package 60 from being invoked and simulation data from being broadcast when the latter is not desired.

Figure 4:
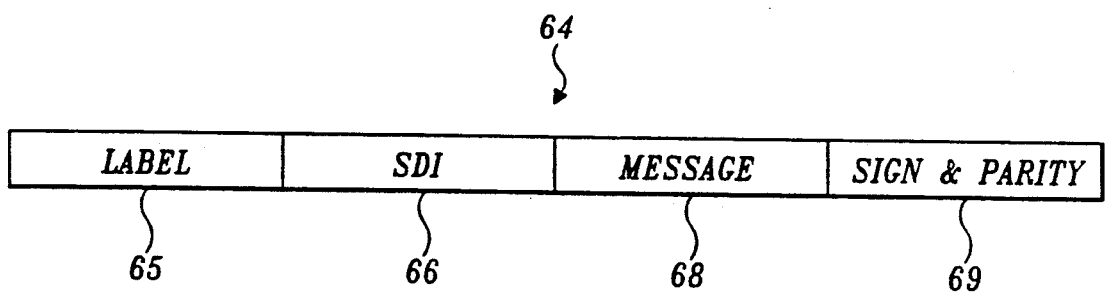
FIG. 4 depicts the format of an ARINC word that is transferred between line-replaceable units.

Buses 46 that link the LRUs 30-44, are industry standard ARINC-429 communication buses. Data is exchanged between the LRUs 30-44 in the form of ARINC words 64, one of which is depicted in FIG. 4. Each ARINC word 64 contains a label 65, a source destination indicator code (SDI) 66, a message 68, and a sign and parity block 69. The label 65 identifies the specific content of the word 64. Labels 65 are used to identify the words, e.g., airspeed data or engine compression ratio data, or a command to invoke a simulation package 60. The SDI code 66 contains an indication of the LRU 30-42 or 44 that sent the ARINC word 64. The message 68 is the actual data or command contained in the word 64. The sign parity block 69 contains control and air information necessary to insured that data are accurately exchanged over the buses 46.

It will be recognized that in the foregoing discussion, the features of aircraft 12 and specific LRUs 30-44 are described for purposes of illustration only. Any particular aircraft 12 may have fewer or more LRUs than described. In actuality, large commercial aircraft have significantly more LRUs, a number of which are redundant. For example, an aircraft may be provided with multiple ADCs 32 or EIUs 38. The actual structure of any LRU processor may likewise vary. Some of the LRUs 30-44 are designed to perform relatively simple tasks, for example, simply to transmit information from transducers to other LRUs, and do not require a central processing unit 50 controlled by an LRU operating system 58. LRUs 30-44 designed to accomplish a number of tasks simultaneously may have multiple central processing units 50 or multiple memories 52. It should be understood that each LRU 30-44 is provided with the appropriate interconnections, such as buses 46, to one, two or more LRUs and other aircraft components as may be required. The preferred form of communication between the LRUs 30-44 using ARINC words 64 is similar illustrative. Other schemes for exchanging digitally encoded information can alternatively be used for communication between the LRUs 30-44.

Integrated aircraft test system 10 (FIG. 1) of this invention is used to perform a variety of functional tests on components and subsystems of the aircraft 12. The central control unit 22 is used to monitor the work performed on the aircraft 12. In response to a specific assembly or maintenance function being performed, the central control unit 22 provides an indication at the test action station 26 of the functional tests that need to be performed on the aircraft. Each ATE 14-20 is designed to automatically provide the appropriate stimuli and take the appropriate measurements needed to test specific components and subsystems. During functional testing, each ATE is connected to the aircraft through the CMC 44. The CMC 44 serves as an interface through which the ATEs 14-20 can obtain information from other LRUs 30-42 and can invoke the LRU simulation packages 60 so that the functional testing can be thoroughly performed.

Each ATE 14-20 includes a number of test instruments that are designed to perform functional tests performed on aircraft components and subsystems associated with a designated aircraft 12 system. Specifically, ATE 14 includes test instruments for testing components and subsystems associated with the flight controller system; ATE 16 includes test instruments for testing components and associated with the avionics system; ATE 18 includes test instruments for testing the components and subsystems associated with the aircraft engine systems; and, ATE 20 includes test instruments for testing the components and subsystems associated with the aircraft power system.

As depicted by link 70, shown partially in solid and partially in phantom aspect, each ATE 14-18 or 20 is selectively connected to aircraft 12 so that the functional tests performed by the ATE can be run. As the testing of the aircraft 12 progresses, the ATE 14-18 or 20 internally stores the test results. After the ATEs 14-20 are used to run tests on one or more aircraft 12, the ATEs are then connected to the central control unit 22 by a communications link 72, also shown partially in solid and partially in phantom aspect. Central control unit 22 retrieves the test results for the aircraft 12 from the ATEs 14-20 and archives the results in the permanent memory 24. The ATEs 14-20 are used to run tests on specific systems of the aircraft 12 during its manufacture, or after it is operational, during maintenance inspections.

The integrated aircraft test system 10 of this invention also includes a certification cart 28 and the remote access terminal 21. The certification cart 28 contains a number of certification instruments used to certify that the test instruments on the ATEs 14-20 operate properly and within accuracy specifications. When the certification cart 28 is connected to an ATE, for example, to ATE 16 as represented by link 73 therebetween, the ATE controls both the test instruments and the instruments on the certification cart to carry out programmed certification tests. The results of the certification tests are then stored in the central control unit memory 24. A more complete explanation of an exemplary certification cart 28 is set forth in commonly assigned copending U.S. patent application Ser. No. 07/467,772, filed concurrently with this application for an Integrated Certification-Calibration System For a Test System Having Multiple Test Instruments by R. Bird and D. Schaffer, the specification of which is incorporated herein by reference.

Remote access terminal 21 has a pad-size portable display panel controlled by an internal processor. The remote access terminal is used by a technician to perform functional tests on the aircraft 12 that are carried out manually. For example, the remote access terminal 21 is carried with the technician when tests of the aircraft cabin lighting systems are conducted. The display panel has a touch screen face so that a technician can enter information into a processor memory. The remote access terminal 21 has a memory in which test instruction sets 228 and 229 (FIG. 10) for manually performed tests are stored. The processor retrieves the stored test instructions and presents them on a display screen 29. The display screen has a touch screen face so that the technician can enter the results of the tests by touching the face of the panel. At the conclusion of functional testing, the remote access terminal 21 is attached to a holster associated with the central control unit 22 or with a test access site 26 (holster not illustrated). The test results stored in the remote access terminal processor 21 are then unloaded into the central control unit memory 23 through the holster. A more complete explanation of an exemplary remote access terminal 21 is set forth in commonly assigned copending U.S. patent application Ser. No. 07/148,421, filed Jan. 25, 1988, for a Battery-Operated Data Collection Apparatus Having an Infrared Touch Screen Data Entry Device, incorporated herein by reference.

Figure 5:
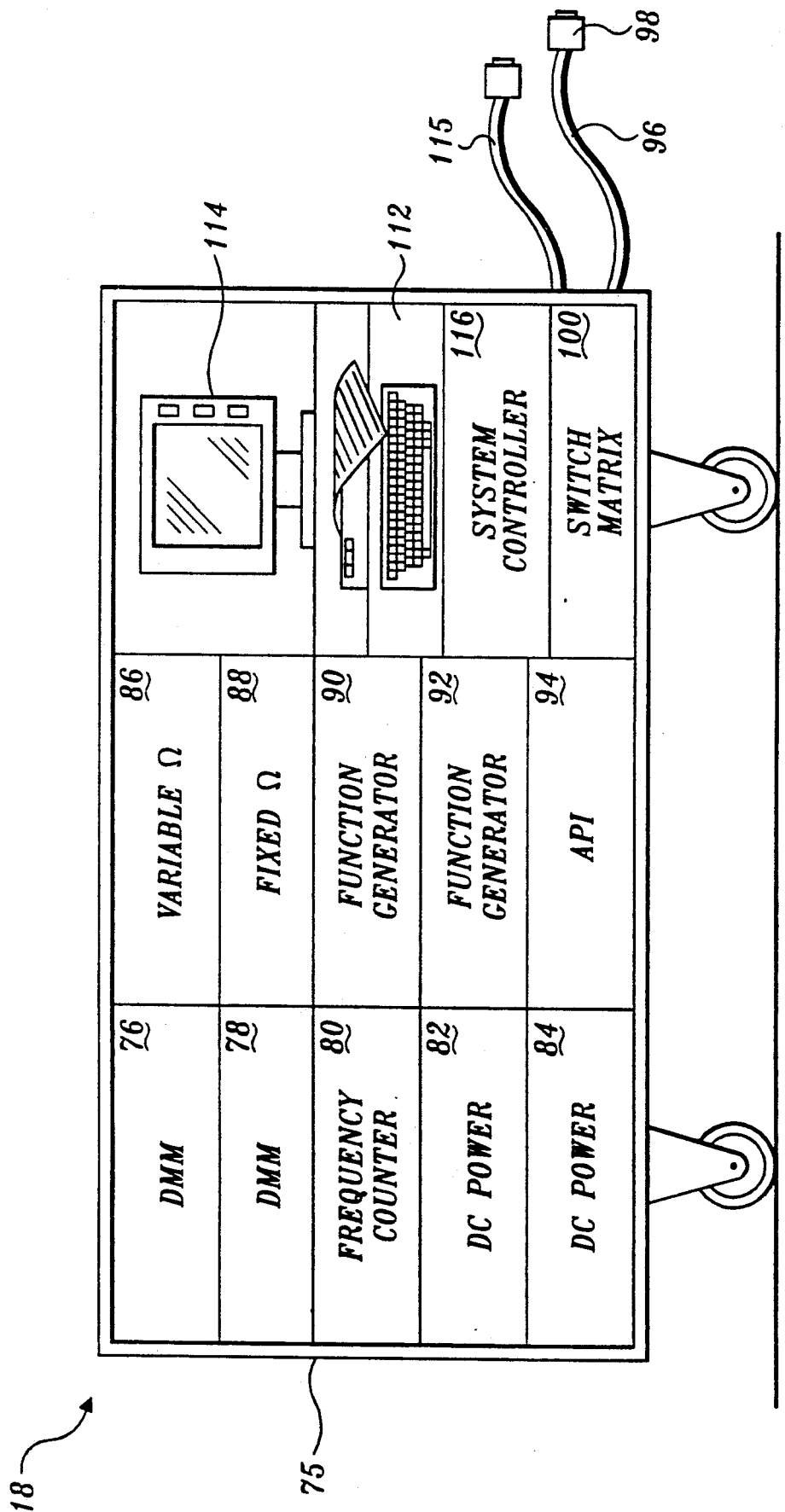
FIG. 5 is a front view of an exemplary automatic test equipment cart constructed in accordance with this invention.

With this basic understanding of the integrated aircraft test system 10, the system will be explained in greater detail by initial reference to FIG. 5, which illustrates the ATE 18, referred to as engine simulator ATE 18, and which is representative of the ATEs 14-20. Engine simulator ATE 18 is designed to simulate and monitor signals generated and received by the EECs 30 that are integral with engines mounted to the aircraft 12. Stimuli from engine simulator ATE 18 and measurements taken therefrom are used to functionally test components and subsystems of the aircraft that either respond to signals from the engines, or generate control information to the engines. Tests performed by the engine simulator ATE 18 include: verifying the integrity of wiring to the EECs 30; testing the functionality of engine control circuits; and, testing annunciator systems that report engine state information.

Engine simulator ATE 18 comprises a portable cart 75 with a number of test instruments 76-94 that either generate stimuli normally transmitted by an EEC 30 or measure signals received thereby. Two digital multimeters (DMMs) 76 and 78, respectively, measure resistances, voltages, and currents. Frequency counter 80 measures the frequency of any periodic signals. A first DC power supply 82 provides output voltages between 0.5 and 10 volts DC. A second DC power supply 84 is used to provide output voltages between 0.5 and 50 volts DC. Loads ranging from 25 to 20,000 ohms are provided by a variable programmable resistor 86, while a set of load resistors 88 provide a set of commonly used fixed resistance load resistors. Function generators 90 and 92 serve as a source for variable shape, voltage, and frequency AC signals. An angular position indicator 94 is used to measure mechanical angular displacement as a function of the relative magnitude of two voltages. Each of the ATE instruments 76-94 is processor controllable. In other word, test instruments 76-94 which are used for measurement operation in response to processor instructions are designed and report the measurement results over digital data processing communication links. Test instruments 76-94 that generate stimuli do so in response to processor commands.

Engine simulator ATE 18 is connected to the aircraft 12 by a signal interface cable 96. Signal interface cable 96 is connected into an engine strut where an EEC 30 is normally attached to the aircraft 12. This interconnection enables the engine simulator ATE 18 to generate signals normally generated by the EEC, and to measure the signals normally received by the EEC. An engine simulator ATE 18 for a multi-engine aircraft 12 is normally provided with separate signal interface cables 96 for each EEC 30. The multiple cables make it possible for the engine simulator ATE 18 to apply stimuli to and measure the responses for signals normally simultaneously transmitted and received by the multiple EECs 30. Rapid sequential application and measurement of signals transmitted and received by the separate EECs 30 is also possible with multiple signal interface cables 96. Each signal interface cable 96 has a cable head 98 with a number of interconnect pins (not illustrated) for signal exchange identical to the number of pins associated with each EEC 30. In one embodiment of the invention, cable head 98 has 350 pins over which individual signals are exchanged with the aircraft 12.

Figure 6:
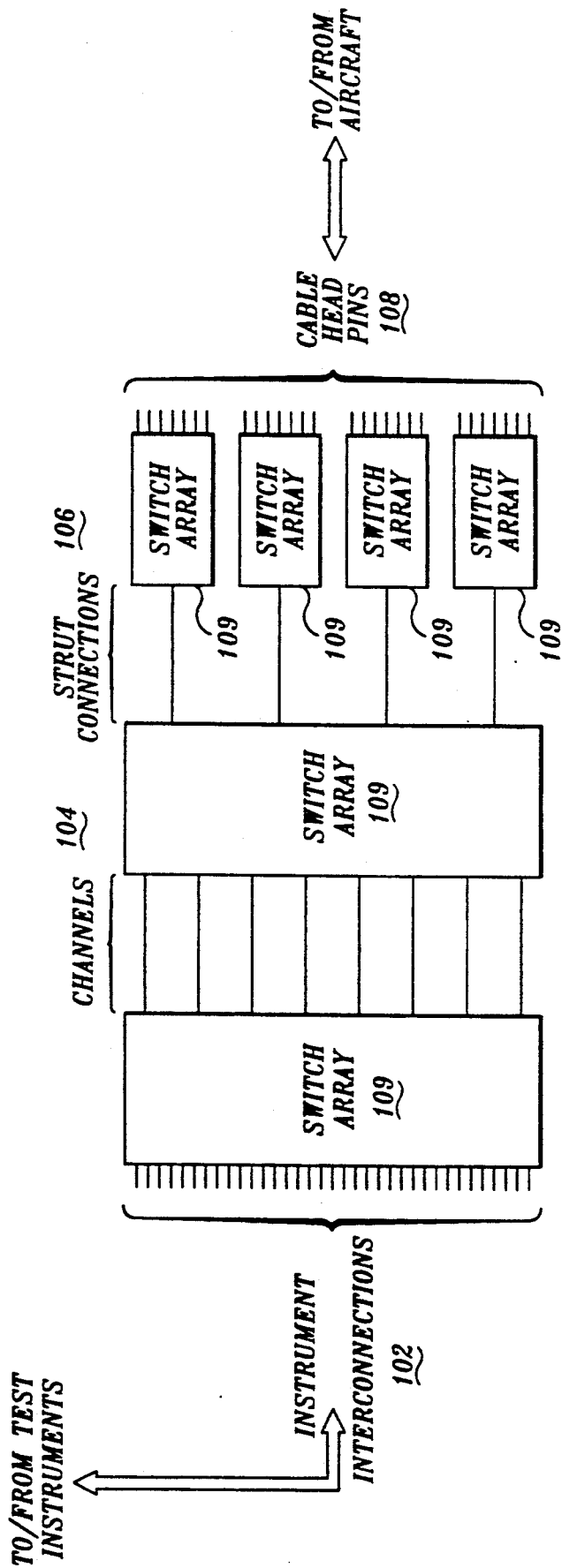
FIG. 6 is a functional block diagram of a switch matrix on the automatic test equipment cart of FIG. 5.

A processor controllable switch matrix 100 controls the interconnection between the ATE test instruments 76-94 and the pins in the signal interface cable head 98. The interconnections established by switch matrix 100 are shown in block form in FIG. 6. Engine simulator ATE 18 has 80 instrument connections, represented by lines 102, and can be selectively made to one of eight channels, represented by lines 104. Instrument interconnections 102 are the actual connections to the test instruments 76-94 such as ground and signal connections to the DMM 76 and 78 and ground and signal connections to the first and second DC voltage sources 82 and 84. Channels 104 are connected to strut connections, represented by lines 106, which are the actual connections to the separate signal interface cables 96. In the depicted embodiment, aircraft 12 has four EECs 30 so that engine simulator ATE 18 has four signal interface cables 96, only one of which is shown, and switch matrix 100 has four strut connections 106. Switch matrix 100 establishes an interconnection between the strut interconnections 106 and the individual pins, represented by lines 108, in a specific cable head 98. The switch matrix 100 includes a number of processor controllable switches that collectively form a switch array 109 that establishes the appropriate interconnections. Switch matrix 100 can thus be used to interconnect any instrument 76-94 with any cable head pin 98 on any of the signal interface cables 96.

Switch matrix 100 can also be used to interconnect instruments 76-94 on the ATE 18. For example, the output from one of the function generators 90 or 92 is supplied to the angle position indicator 94 through the switch matrix 100.

A system controller 110 (FIG. 5) controls the ATE 18 and the running of the aircraft functional tests performed thereby. Specifically, system controller 110 is connected to and controls ATE test instruments 96-94, the interconnections being established by switch matrix 100, and exchanges data with aircraft LRUs 30-44. Data and instructions from and to the operator are exchanged with the system controller 110 through a keyboard-printer unit 112. A display touch screen 114 is also connected to the system controller 110 so that persons working with the ATE 18 can exchange information and instructions with system controller 110 by simply looking at and touching the screen face. In the preferred embodiment of the invention, display touch screen 114 is connected to system controller 110 by relatively long cable, not illustrated, so that a technician may take the screen into the cockpit of the aircraft 12. During functional testing the technician can thus control the ATE 18 from the cockpit where switches can be set and annuciators observed as may be required during the course of any test. Optionally, it may be desirable to provide multiple keyboard-printer units 112 or multiple display touch screens 114 so that two or more technicians can participate in the functional testing. System controller 110 is also connected to the aircraft CMC 44 by a CMC cable 115.

Figure 7:
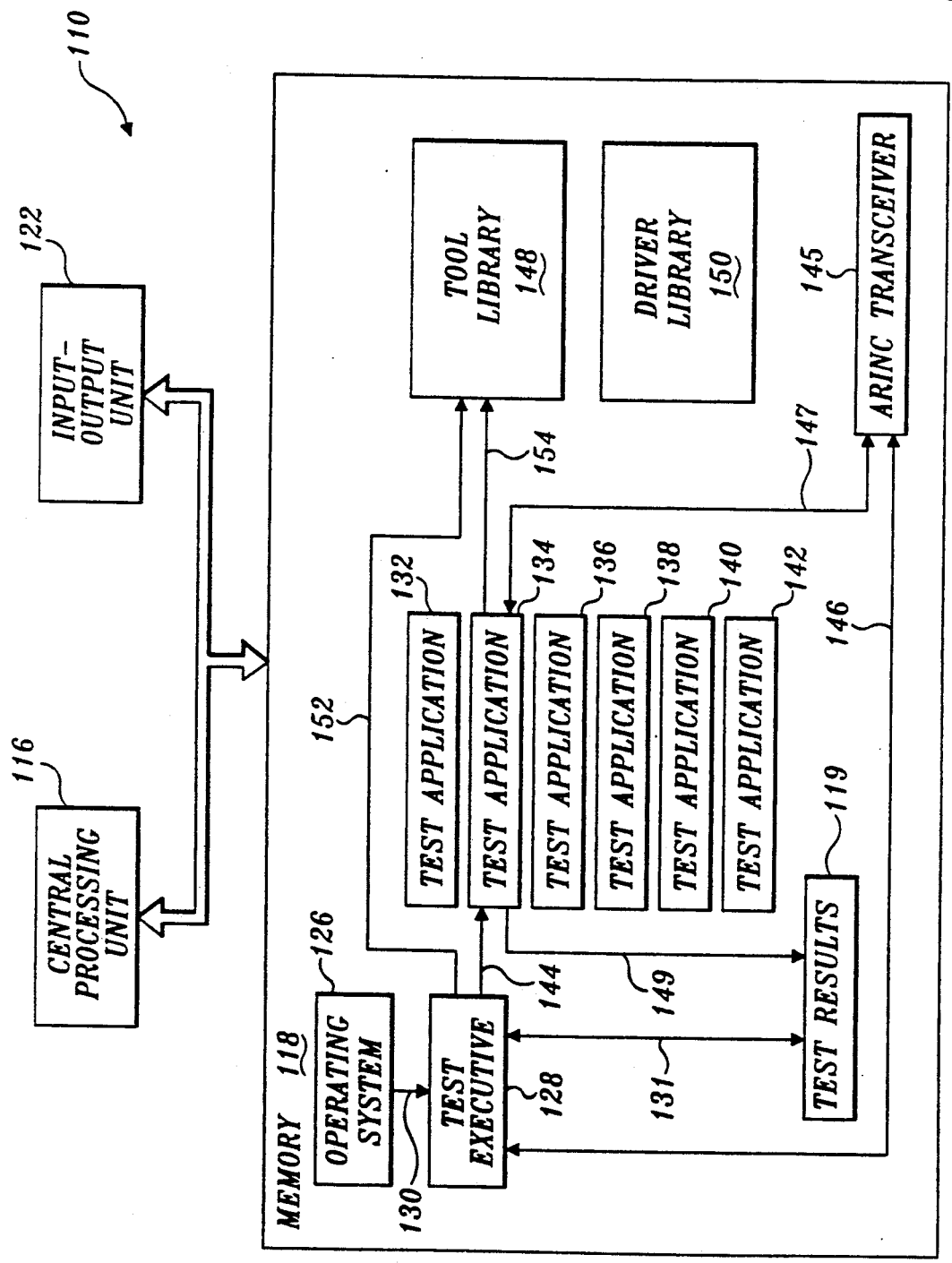
FIG. 7 is a block diagram of processing elements of a system controller on the automated test equipment cart of FIG. 5, wherein individual programs that control the operation of the cart are depicted as separate modules within the controller.

Primary elements of the ATE system controller 110 are depicted in block diagram in FIG. 7. A central processing unit 116 controls the operation of ATE 18 in response to sets of program instructions. A memory 118 stores instructions used to run ATE 18 and also test results 119 developed during the running of the functional tests. System controller 110 has a number of input/output units 122 through which the controller exchanges instructions and data with other elements of the integrated aircraft test system 10. Specifically, input/output units 112 provide for information exchange with: aircraft LRUs 30-44; test instruments 76-94; switch matrix 100; central control unit 22; keyboard-printer 112; and, display touch screen 114. One or more communication buses 124, only one of which is shown, are connected between central processing unit 116, memory 118, and input/output units 112 to allow for the exchange of data therebetween.

Specific programs that control engine simulator ATE 18 are depicted as modules inside system controller memory 118. An operating system 126 serves as a housekeeping controller. Operating system 126 controls ATE 18 when first initialized, and is used to store and maintain operating information required by the system controller 110. The type of information operating system 126 maintains includes the serial numbers of test instruments 76-94 and an indication of whether each instrument 76-94 is certified to perform functional testing. As depicted by arrow 130, operating system 126 invokes a test executive 128 after the operating system has initialized the system controller 110. The test executive 128 controls the test instruments 76-94 and switch matrix 100. Test executive 128 is used by technicians to manually control the test instruments 76-94 when manual operation of the instruments is desired. The test executive 128 also allows the technician to store or retrieve test results 119, as represented by bidirectional arrow 131.

System controller 110 also includes a number of test applications 132-142, each of which is a set of processor-executable instructions for performing a specific functional test on the aircraft 12. Individual test applications 132-142 are executed by system controller 110 in response to invocation calls made by test executive 128, as represented by arrow 144 to test application 134. Each test application 132-142 contains instructions for controlling the test instruments 76-94 needed to perform the functional test. The test applications 132-142 also include instructions for invoking LRU simulation packages 60 so that during functional testing any required simulation data will be broadcast. Test applications 132-142 include instructions that write the results of the testing into the memory 118 as test results 119, as represented by arrow 149.

An ARINC transceiver 145 is used by system controller 110 for exchanging ARINC words 64 with LRUs 30-44. As represented by bidirectional arrows 146 and 147, ARINC transceiver 145 is accessed by test executive 128 or test applications 132-142.

System controller 110 also includes a tool library 148 and a driver library 150. The tool library 148 contains general sets of instructions for controlling the test instruments 76-94 and switch matrix 100 and invokes the LRU simulation packages 60 to cause simulation data to be broadcast. Tool library 148 is accessed by test executive 128 and test applications 132-144 to control the test instrument simulation packages as is represented by arrows 152 and 154, respectively. Driver library 150 contains specific instructions for operating test instruments 76-94 and switch matrix 100.

Figure 8:
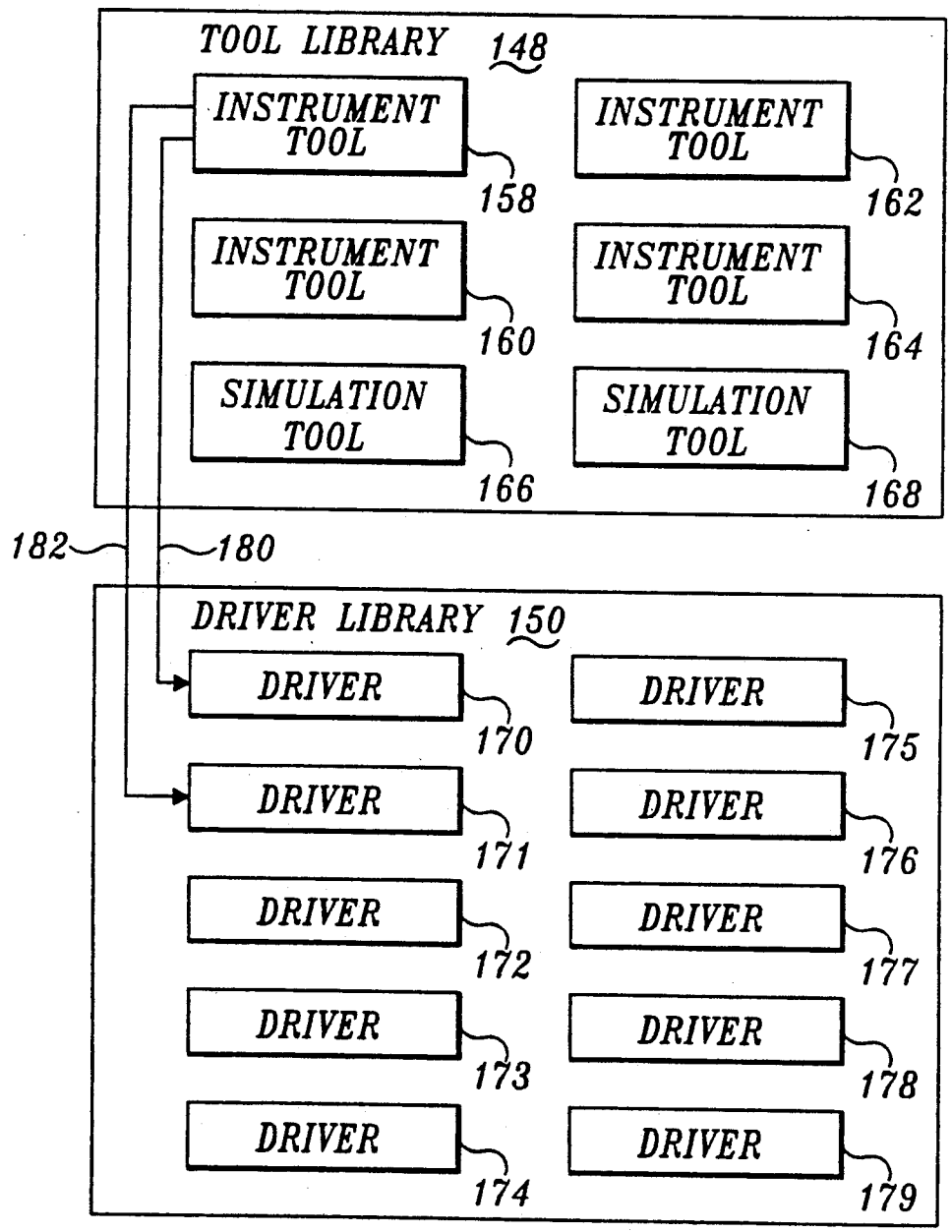
FIG. 8 is a block diagram of the contents of the tool library and driver library of the system controller of FIG. 7, wherein individual tools and drivers are depicted as separate modules.

The relationship between tool library 148 and driver library 150 may be best understood by reference to FIG. 8 which depicts both libraries in detail. Tool library 148 contains a number of instrument tools 158-164 and simulation tools 166 and 168. The instrument tools 158-164 are each general sets of instructions for performing a specific task with a test instrument 76-92 or 94 or switch matrix 100. Instrument tool 158, may, for example, be a set of general instructions that direct DMM 76 to make a resistance reading. Instrument tool 160 may be a set of instructions that direct the second DC voltage source 84 to generate a specific voltage. Simulation tools 166 and 168 are sets of instructions the system controller 110 transmits to the aircraft 12 to cause simulation data to be broadcast. Simulation tool 166, may, for example, be a set of instructions that direct FCU 36 to broadcast simulation data indicating the flaps are extended, when, in fact, they are not. Simulation tool 168 may contain a set of instructions that direct ADC 32 to broadcast simulation data indicating aircraft 12 is in flight at a given airspeed, when in fact it is on the ground.

Driver library 150 contains a number of individual drivers 170-179 that are specific instructions for control of test instruments 76-94 and switch matrix 100. Drivers 170-175 may, for example, contain instructions transmitted to DMM 76, while drivers 176-179 may contain instructions for the second DC voltage source 84. Specifically, driver 170 may be an instruction to DMM 76 to enter a resistance measurement mode, and driver 171 an instruction for the DMM to measure and report resistances between its inputs. When an instrument tool 158-162 or 164 is invoked by the test executive or a test application, the tool, in turn, invokes one or more drivers 170-179 to manipulate a test instrument. For example, when resistance measuring tool 158 is invoked, the tool invokes driver 170 to place DMM 76 in a resistance measuring mode as represented by arrow 180. Instrument tool 158 then invokes driver 171, as represented by arrow 182, to obtain a resistance reading. In this manner, when a particular instrument 76-94 is used for functional testing, the appropriate tool 158-164 for the instrument is invoked, which in turn invokes the appropriate drivers 170-179 that directs the instrument to perform the desired operations.

Figure 9:
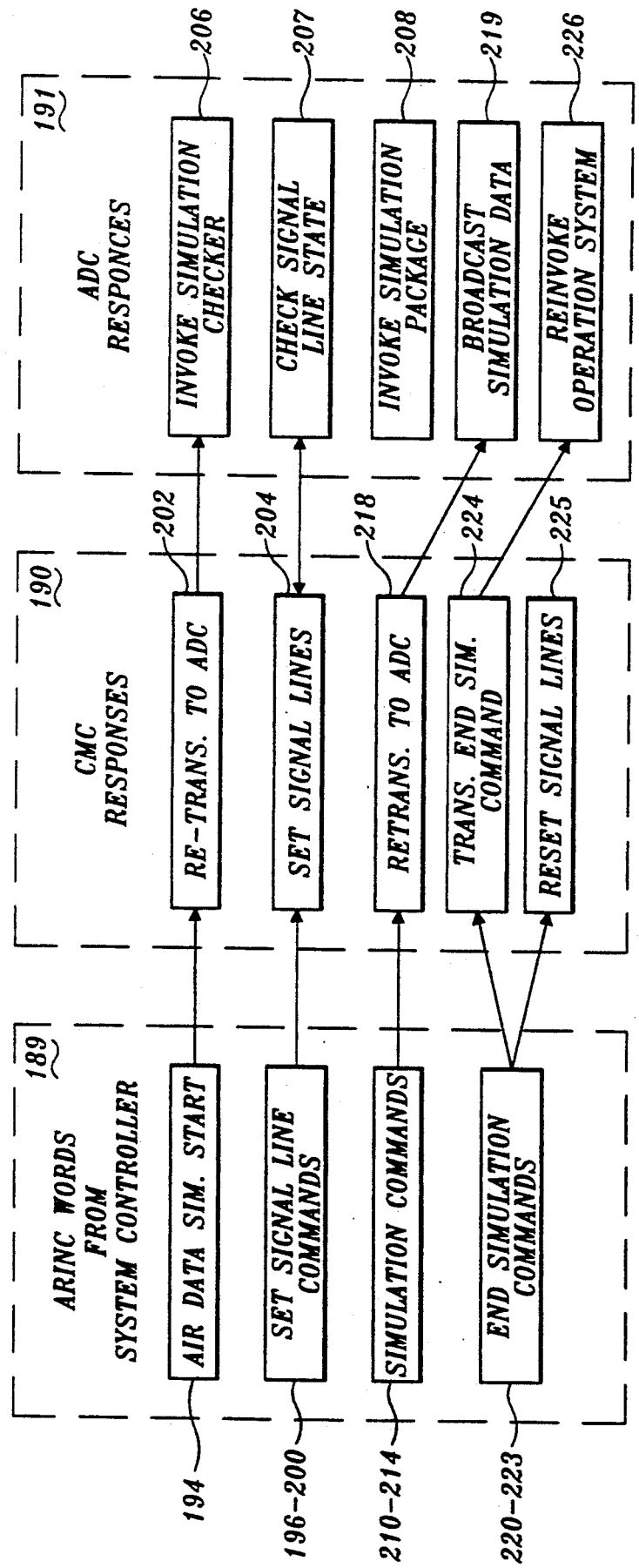
FIG. 9 is a block diagram of ARINC words generated by the ATE system controller to cause the aircraft line-replaceable units to broadcast simulation data and of responses of the line-replaceable units to the ARINC words.

Simulation tools 166 and 168 are invoked during functional testing when it is necessary to broadcast simulation data during the testing process. By way of example, FIG. 9 depicts in block 189 the ARINC words 64 generated by the system controller 110 when simulation tool 168 is invoked so that simulated airspeed data can be generated. The figure also depicts, by way of blocks 190 and 191 respectively, the response of aircraft CMC 44 and ADC 32 when simulation tool 168 is invoked.

The simulation process starts with the ATE system controller 110 transmitting an air data simulation start word 194 to CMC 44 over CMC cable 115. System controller 110 then transmits a set of discrete signal line command words 196-200 to ground specific CMC signal lines, indicating ADC 32 simulation is desired. The CMC 44 responds to the command word 194 by retransmitting a similar command 202 to the ADC 32. In response to the discrete signal line commands 196-200, CMC 44 sets the appropriate signal lines to ground 204. The ADC 32 responds to the simulation command word 194 by invoking the simulation checker 62 (FIG. 3) for execution 206. Simulation checker 62 checks the status of the appropriate signal lines to determine if the CMC 44 has placed signals on those lines that indicate the simulation state is desired 207 as represented by the bidirectional arrow to the set signal lines step 204. Since the signal lines were set to ground, simulation checker 62 invokes simulation package 60 for execution 208. The ADC 32 is now under control of simulation package 60 and broadcasts ARINC words 64 containing simulation data for functional testing.

System controller 110 now generates simulation command words 210-214 that contain the exact simulation information ADC 32 should transmit. Simulation command words 210-216 are transmitted to CMC 44, which retransmits the words 218 to ADC 32. Upon receipt of the simulation command words, ADC 32 broadcasts simulation data 219 that ATE 18 needs in order to run a particular functional test.

At the conclusion of testing, system controller 110 broadcasts one or more end simulation command words 220-223. The CMC 44 responds to the end simulation command words 220-223 by transmitting an end simulation command 224 to the ADC 32. The CMC 44 also resets the discrete signal lines 225 so that they no longer indicate that ADC simulation is desired.

The ADC 32 responds to the retransmitted end simulation command by reinvoking the LRU operating system 58 for execution 226 to control ADC 32. The ADC 32 returns to broadcasting ARINC words 64 with true information about the parameters the ADC monitors.

Figure 10:
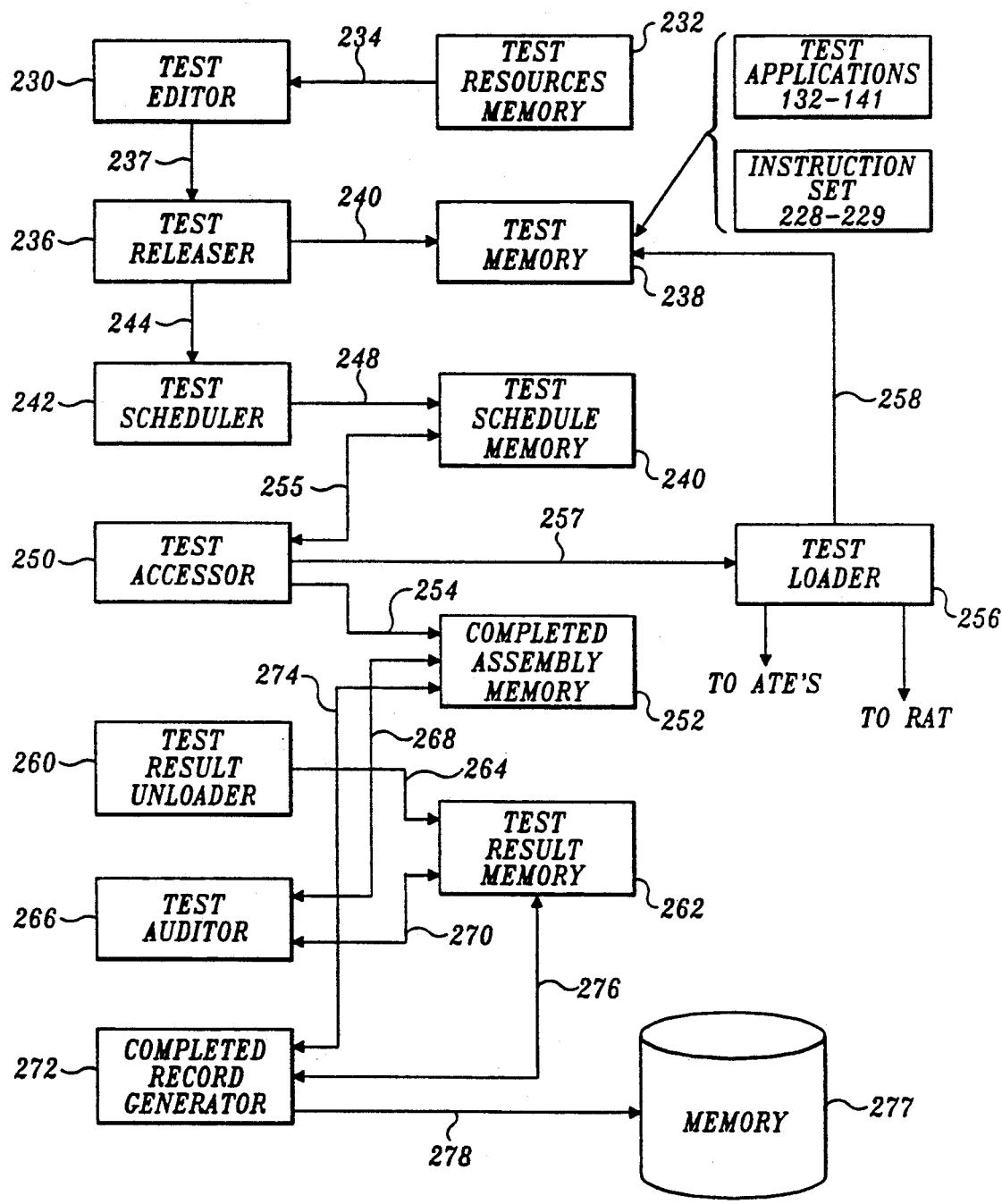
FIG. 10 is a block diagram of the processing and memory elements of the central control unit of FIG. 1, wherein individual programs and memory sections used to create, schedule, analyze, and store the results of functional tests performed by the system are depicted as separate modules within the central control unit and the associated memory.

The creation of the test applications 132-142, the execution of the functional tests, and the monitoring of their results are performed by and through a set of programs run on the central control unit 22 depicted in FIG. 10. A test editor 230 is used by personnel familiar with the aircraft functional requirements to develop both test applications for the ATEs 14-20 and test instructions 231 that are loaded into the remote access terminal 21. The test applications 132-142 and instructions 228 and 229 are developed at the test development sites 24 and 25. Personnel developing the tests have access to a test resources memory 232 that contains a number of subroutines that are portions of functional test procedures. As represented by bidirectional arrow 234, the test resources memory 232 is loaded and accessed through the test editor 230. It is understood that test resources memory 234, like each of the below-described memories, is a specific part of the central control unit memory 23 unless specifically stated otherwise.

After each test application and test instruction is created, it is loaded into a test releaser 236, as represented by arrow 237. The test releaser 236 stores the newly created test application 132-141 or test instruction set 228 or 229 in the memory 23 so it can be reviewed by supervisory/inspection personnel at the test development site 24 or 25. The test releaser 236 holds the application or instruction set until the supervisory/inspection personnel certify that it contains the necessary test steps for the intended functional test.

Once the test releaser 236 receives an indication that the test application 132-141 or instruction set 228 or 229 is certified, the application or instruction set is loaded into a test memory section 238 of the memory, as represented by arrow 240. A test completed message (not illustrated) is also sent from the test releaser 236 to a test scheduler 242, as represented by arrow 244. Assembly and maintenance scheduling personnel at test development sites 24 or 25 or test information site 27 use the test scheduler 242 to schedule a time, during the aircraft manufacturing or maintenance, that the particular functional test described by the test application or instruction set should be performed. To assist in the scheduling of the functional test, the test scheduler contains a list of each assembly or maintenance step performed on the aircraft. The scheduling personnel can match the test application or instruction step with the appropriate manufacturing or maintenance process. Alternatively, the test scheduler may hold the test application 132-141 or instruction set 228 or 229 until scheduling personnel identify and enter into the scheduler 242 the name of a particular assembly and/or maintenance process with which the functional test should be associated.

After the test application 132-141 or instruction set 228 or 229 is associated with a particular assembly and/or maintenance process, the test scheduler 242 loads the identity of the application or instruction set in a test schedule memory 246 as represented by arrow 248. The test schedule memory 248 is a look-up table that contains a list of each assembly and/or maintenance process performed on the aircraft and the identities of functional tests that are performed after the process is completed.

Assembly and/or maintenance personnel enter an indication of work performed on the aircraft 12 at either a test access station 26 or a test information station 27. A test accessor 250 responds to this information by making a record of the work performed in a completed assembly memory 252 as represented by arrow 254. Each record (not illustrated) contains the date the assembly/maintenance step was completed, the identity of the person(s) who worked on the aircraft, and any relevant collateral information, such as the serial numbers of the parts installed in the aircraft. Test accessor 250 also accesses the test schedule memory 248, as depicted by bidirectional arrow 255, to determine the identities of any functional test that should be performed after the completed assembly/maintenance process. The test accessor 250 displays the names of the functional tests to be performed to the test technician at the test access station 26 when he/she looks to see what functional tests need to be performed on the aircraft 12.

The test accessor 250 also activates a test loader 256, as depicted by arrow 257, and sends it the identities of the test applications or instruction sets that contain the instructions of the functional tests that need to be performed on the aircraft 12. The test loader 256 retrieves the appropriate test applications or instruction sets from the test memory 238, as represented by bidirectional arrow 258. The test loader loads the test applications into the system controller 110 on the appropriate ATEs 14, 16, 18, or 20. The test loader 256 also loads the selected instruction sets into the remote access terminal 21 through the holster to which the terminal is connected. When loading the test applications and instruction sets, the test loader 256 relies on header information associated with each application and instruction set to load the applications and instruction sets into the appropriate ATEs 14, 16, 18, or 20, or remote access terminal 21.

After the functional tests have been performed on the aircraft 12 and the ATEs 14-20 and remote access terminal 21 are reconnected to the central control unit 22, a test result unloader 260 retrieves the results of the functional tests. The test result unloader 260 stores the functional test results in a test results memory 262, as represented by arrow 264. Personnel at test information stations 27 can access the test results memory to review the test results as may be required (connection not shown).

At times during the aircraft assembly and maintenance processes, a test auditor 266 is used to review the work and the functional tests performed on the aircraft 12. The test auditor 266 accesses the completed assembly memory 252, as represented by bidirectional arrow 268, to determine what work has been done on the aircraft, as represented by bidirectional arrow 268. After reviewing the work performed on the aircraft 12, the test auditor accesses the test results memory 262, as represented by bidirectional arrow 270. The test auditor then reviews the functional test results against the work done. If the review indicates that certain required functional tests have not been performed on the aircraft 12, or that those tests indicate that the tested components failed functional testing, the test auditor 266 displays an appropriate missed/failed test message (not illustrated), a test information site 27 and/or a test access station 26 indicating the nature of the missed or failed test. Personnel working on the aircraft are then able to take appropriate remedial action.

At the end of the aircraft assembly process, or at periodic intervals during the lifetime of the aircraft, a completed record generator 272 is used to make periodic records of the assembly, maintenance, and functional testing of the aircraft. The completed record generator retrieves the assembly or maintenance records from the completed assembly memory, as represented by bidirectional arrow 274, and the functional test results from the test results memory 262, as represented by bidirectional arrow 276. The completed record generator 272 writes the retrieved information in a permanent memory 277, as represented by arrow 278. The permanent memory 276 is separate from the central control unit memory 23 and is typically a write-only type of memory, such as an optical disk. The aircraft assembly, manufacture, and maintenance records are then always available for review as may be required. The central control unit 22 can erase the assembly, maintenance, and functional test records from the memory 23 so that memory space is free for new records that contain information about the aircraft 12.

Figure 11:
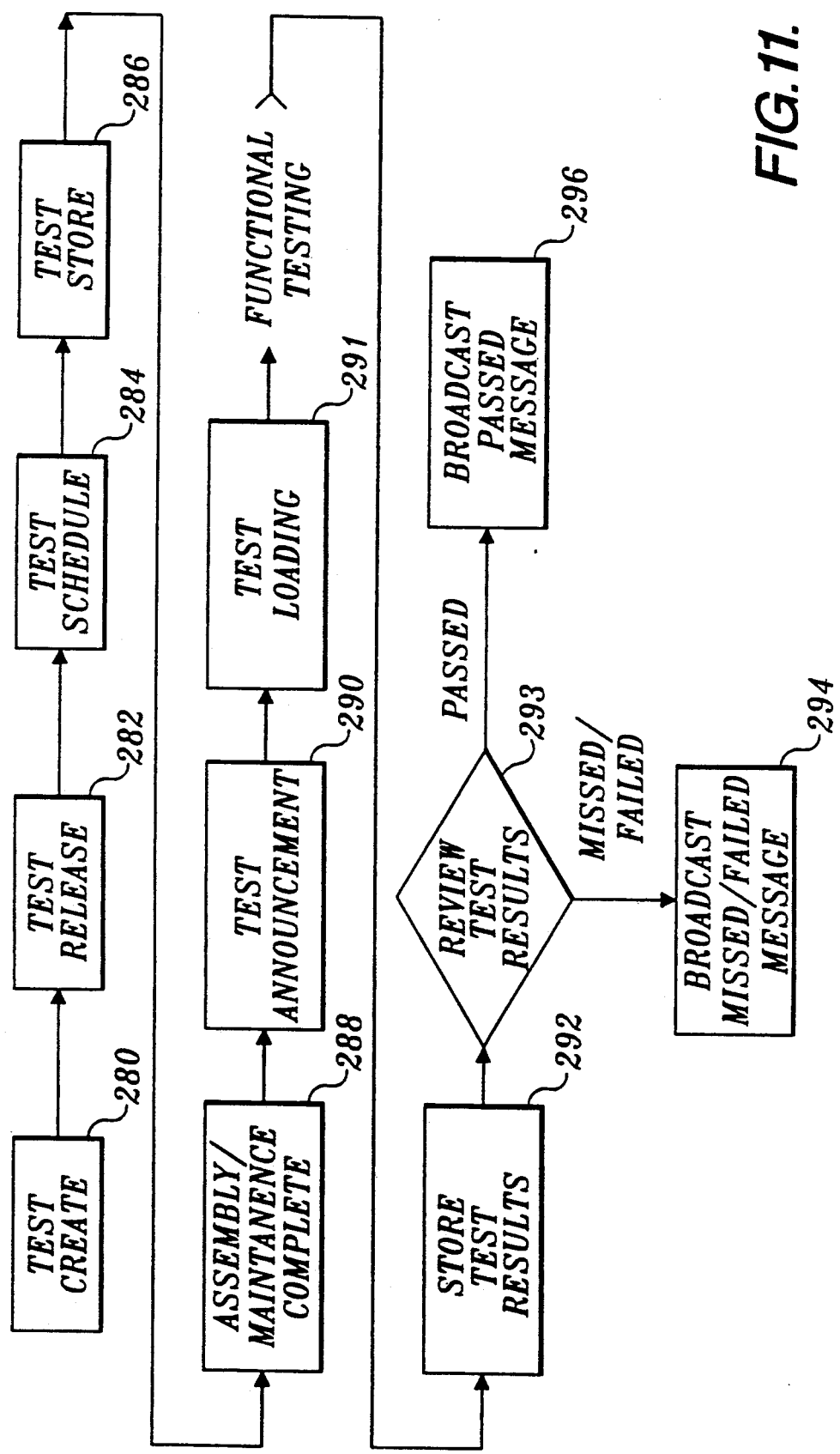
FIG. 11 is a flow chart or process diagram of the creation, scheduling, and analysis of an aircraft functional test performed by the system of this invention.

The creation, execution, and review of an aircraft functional test is explained in detail with reference to the flow chart of FIG. 11. There is an initial test create step 280 wherein personnel familiar with the functional test requirements use the test editor 230 and the tools available from test resources memory 232 to develop a test application or instruction set that contains the desired functional test steps. After the test application or instruction set is created, it is subjected to a test release step 282. In the test release step, the test releaser 236 holds the test application or instruction set so that supervisory personnel can inspect it and certify it contains the desired test steps.

When the test application or instruction set is certified, it is subjected to test schedule and test store steps 284 and 286 that may be performed sequentially or simultaneously. In the test schedule step, scheduling personnel use the test scheduler 242 to determine when, during the assembly and manufacturing processes, the functional test described by the test application or instruction set should be performed. The test scheduler 242 attaches the test identity to the appropriate assembly and maintenance processes in the test schedule memory 248. In the test store step 286, the test releaser 236 stores the test application or instruction in the test memory 238.

The test application resides in the test memory 238 until an assembly/maintenance complete step 288. In the assembly/maintenance complete step, assembly or maintenance personnel indicate through the test accessor 250 that a particular assembly or maintenance activity has been completed on the aircraft 12. The test accessor 250 reviews the test schedule memory 248 to determine which functional tests need to be performed on the aircraft 12. The test accessor 250 then performs a test announcement step 290 and displays on a test access station 26 a list of the functional tests that need to be performed on the aircraft 12. The test accessor 250 also performs a test loading step 291 wherein the test loader 256 is directed to retrieve the appropriate test applications 132-141 and instruction sets 228 and 229 from the test memory 238 and load them in the ATEs 14-20 and the remote access terminal 21 as may be required.

After functional testing on the aircraft 12 is performed, the ATEs 14-20 and the remote access terminal 21 are connected to the central control unit 22 and the test result unloader 260 performs a store test results step 292. In the store test results step 292, the unloader 260 retrieves the test results from the ATEs 14-20 and the remote access terminal 21 and loads them into the test results memory 262.

The test auditor 266 is periodically called upon during the assembly and maintenance of the aircraft 12 to perform a review test results step 293. In this step, the test auditor 266 reviews the functional tests run on the aircraft 12 and the work performed on it. If a scheduled functional test was not performed and/or the test results indicate a faulty component, a broadcast missed/failed test message step 294 is executed wherein the auditor 266 broadcasts the appropriate failure message at a test access station 26 or a test information station 27. If the review step 292 indicates that all functional testing was performed and that the results of the testing are satisfactory, the auditor performs a broadcast aircraft passed message step 296. In the broadcast aircraft passed message step 296, a message that the aircraft has completed all required functional testing to date is displayed at the appropriate test access and test information stations 26 and 27, respectively.

Figure 12A:
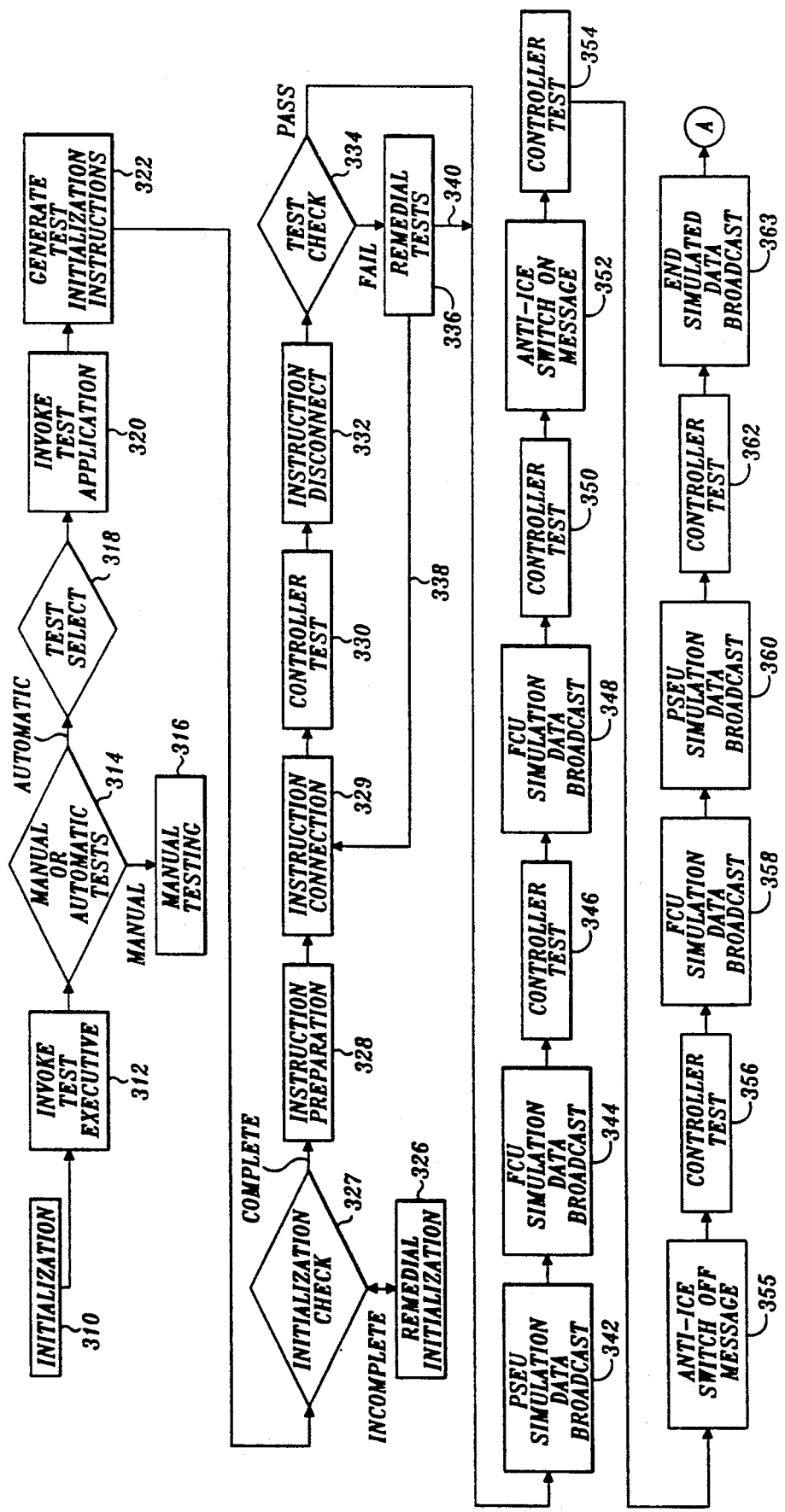
FIGS. 12a and 12b in combination form a flow chart, or process diagram, of an exemplary functional test performed in accordance with this invention.
Figure 12B:
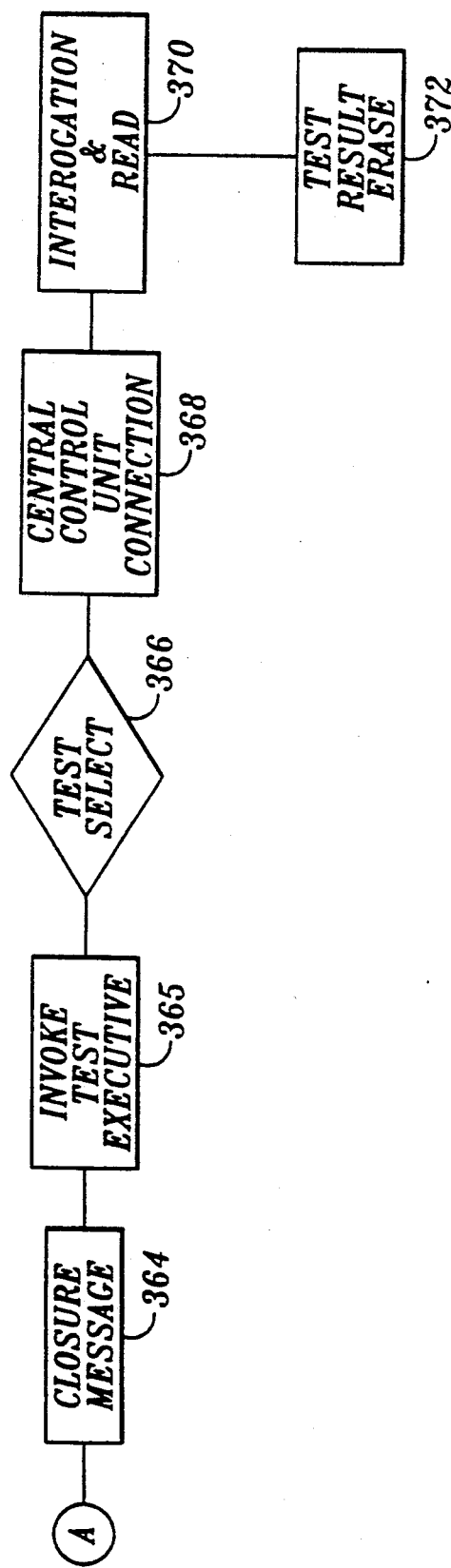

The automatic execution of a functional test by the system will now be explained in detail with reference to the flowchart of FIGS. 12a and 12b. The particular functional test described is used to check the performance of an idle thrust controller (not illustrated) on the aircraft 12, which generates a control signal to the EECs 30 that indicates whether the engines should be idled at a minimum idle thrust or an approach idle thrust. When the aircraft 12 is on the ground the engines should operate at minimal idle thrust. In the air, the engines should idle at approach idle thrust if the engine anti-icing system is on, or if the wing flap position is greater than 23°. Otherwise, the aircraft 12 should be idled at minimum thrust. In one type of aircraft 12, the idle thrust controller sends a signal to each EEC 30 over idle thrust signal lines (not illustrated). When the engines are to operate at minimal idle thrust, the idle thrust controller closes the circuit between the idle thrust signal lines. When the engines are to operate at approach idle thrust, the idle thrust controller opens the circuit between the idle thrust signal lines. The EECs 30 monitor the resistance across the idle thrust signal lines to determine the appropriate idle thrust state for the aircraft engines. Functional testing performed by the ATE 18 ensures the appropriate idle thrust signal line circuit states are asserted in response to the various air, ground, flap, and anti-icing system states of the aircraft.

Functional testing using ATE 18 of this system 10 begins with connecting the ATE to the aircraft 12. Signal interface cables 96 are connected to engine struts where EECs 30 are normally connected. The CMC instrument cable 115 is connected between system controller 110 and CMC 44. As depicted by FIG. 12a, automated functional testing starts with the "boot-up", or initialization step 310 of the ATE 18. Initialization 310 is performed by the system controller operating system 126.

During initialization 310 and throughout the testing process, the system controller 110 generates messages on display touch screen 114 informing the technician of what steps need to be taken during the testing process. The messages may include an instruction that the technician indicate when he has performed the required tasks by generating a "step-completed" message. The step-completed message is used by the system controller 110 as a signal to proceed with the execution of the program running the ATE 18. The step-completed message is normally transmitted to system controller 110 when the technician touches the face of display touch screen 114. Menus offering the technician choices during the testing process and responses thereto are similarly exchanged through the display touch screen 114.

At the end of initialization 310, system controller 110 performs an invocation step 312 that calls test executive 128 for execution. Test executive 128 generates a menu 314, allowing the technician to choose between manual or automated testing. In manual testing step 316, the technician directly controls the test instruments 76–94 and connections established by the switch matrix 100 through the system controller 110. Manual testing step 316 also allows the technician to invoke LRU simulation packages 60 through system controller 110 so that simulation data can be broadcast over ARINC buses 46.

If automated functional testing is elected, system controller 110 generates a menu 318 allowing the technician to select a functional test for automatic execution by the ATE 18. In response to the specific functional test selected, system controller 110 performs an invocation step 320 that calls the appropriate test application, for example, application 134, for execution.

System controller 110, under the instructions of test application 134, initially generates initialization messages 322, that inform the technician of the steps that must be performed so that the test can be processed. The initialization messages 322 include instructions preparing selected test instruments 76–94 for functional testing and reminders to make the appropriate cable connections. Initialization instructions 322 also include instructions to open selected circuit breakers and switches so that annunciators and aircraft components normally responsive to stimuli that will be generated during testing but are not being tested, will not respond.

System controller 110 then performs an initialization complete check 324. Initialization complete check 324 comprises a number of internal self tests performed by the system controller 110 to verify that the planned functional test can proceed. The internal self test includes verifying the test instruments 76–94 on the appropriate state for testing to proceed, and that the appropriate connections have been established between ATE 18 and the aircraft 12. If the initialization complete check 324 indicates an unsuccessful initialization, a remedial initialization step 326 is executed. Remedial initialization step 326 includes additional internal commands to test instruments 76–94 and/or additional messages to the technician as required. As remedial initialization step 326 is performed, initialization complete check 324 may be integrally performed therewith as indicated by bidirectional arrow 327.

After the results of the initialization complete check 324 indicate that the functional testing can proceed, system controller 110 performs an instrument preparation step 328. Instrument preparation 328 involves placing the appropriate test instruments 76–94 in the necessary state to either generate stimuli or take measurements, as required. During instrument preparation 328, the appropriate instrument tools 158–164 and drivers, as described above, are used to set the test instruments 76–94. In the test of the idle thrust controller, instrument preparation 328 includes setting up the appropriate instrument tools and instrument drivers so that one of the DMMs, for example DMM 78, is prepared to measure the resistance.

After instrument preparation 328, functional testing of a particular aircraft 12 component or subsystem can begin. Testing of the idle thrust controller starts with measuring the resistance over the idle thrust signal lines when the aircraft 12 is on the ground. In an instrument connect step 329, switch matrix 100 is set so that DMM 78 is connected to the signal interface cable head 98 pins that are connected to the idle thrust signal lines. A controller test 330, wherein DMM 78 is used to measure the resistance across the idle thrust signals, is then performed. Controller test 330, as does each of the controller tests, also includes the step of writing the test results from the DMM 78 into the system controller memory 118 as test results 119.

Controller test 330 is followed by an instrument disconnect step 332 wherein the DMM 78 to idle-thrust-signal line connections established by switch matrix 100 are broken. The instruments are connected and disconnected from the aircraft before and after each test to prevent spurious signals from harming either aircraft components or the test instruments of 76–94. Instrument connect and instrument disconnect steps 329 and 332 are shown as occurring before and after controller test 330. It is readily understood that these steps respectively precede and follow each and every controller test.

Also following controller test 330 is a test check 334 that may be performed concurrently with instrument disconnect step 332. Test check 254 includes comparing the results of the control test 330 with the expected results also contained within test application 134. The expected results of the initial controller test 330 should be a zero resistance measurement across the idle thrust signal lines. In other words, the test should indicate that the idle thrust controller is asserting the minimal idle thrust signal. If the results are unsatisfactory, remedial test steps 336 may be executed. Remedial test steps 336 include the generation of messages informing the technician of remedial action that should be taken. The remedial test steps 336 may also include still other automated functional tests or checks performed by the system controller 110. At the conclusion of remedial test steps 336, the initial controller test 330 may be performed again as indicated by arrow 338. Alternatively, after the remedial test step 334, the test application 134 may proceed to the next step of the functional test as represented by arrow 340.

The next portion of the idle thrust controller functional testing involves testing the response of the controller to conditions when the aircraft 12 is in the air. The idle thrust controller relies on data from the PSEU 34 that indicate the state of the aircraft landing gear to determine whether the aircraft is on the ground or flying. If the ARINC words 64 broadcast from PSEU 34 indicate the gear is extended, the idle thrust controller considers the aircraft 12 to be on the ground. Conversely, if the broadcast ARINC words 64 indicate the landing gear have been rotated into storage positions, the controller considers the aircraft 12 to be in the air. Air testing of the idle thrust controller starts with test application 134 performing a PSEU simulation data broadcast step 342. PSEU simulation data broadcast 342 comprises invoking the appropriate simulation tools 166-168 so that the PSEU simulation package 60 is effected to generate simulation data. Specifically, PSEU 34 is instructed by ATE system controller 110 to broadcast simulation data over ARINC buses 46 that indicate the landing gear have been rotated when, in fact, the aircraft 12 is still on the ground. The idle thrust controller is now ready for simulated in-the-air testing.

The first air test of the idle thrust controller is to determine whether the system will generate the appropriate approach idle signal when the flaps are extended more than 23°. The test begins with an FCU simulation data broadcast 344. In the FCU simulation, system controller 110 invokes simulation package 60 in FCU 36 using the appropriate simulation tools 166-168. System controller 110 then directs FCU 38 to broadcast simulation data that the flaps are in a landing position. Specifically, the FCU broadcasts simulation data that the flaps are extended to 30°. A controller test 346 follows the FCU simulation data broadcast. Controller test 346 should result in an open circuit measurement between the idle thrust signal lines. In other words, the test should indicate that the idle thrust control is asserting an approach idle thrust signal.

After controller test 346, a test check and remedial test steps similar to the test check 332 and remedial test steps 334 are initiated. To simplify explanation of the functional tests, these checks and remedial steps are not illustrated as following controller test 346, and the subsequent controller tests, but are understood to be performed by system controller 110.

Following controller test 346 of the flaps-extended state, an FCU simulation data broadcast step 348 begins as system controller 110 directs FCU 36 to broadcast simulation data that the flaps are retracted to a position less than 23 degrees. Immediately following broadcast step 268 is another controller test 270. Controller test 350 is used to measure how quickly the idle thrust controller changes from asserting an approach idle thrust signal to asserting a minimum idle thrust signal. For one particular type of aircraft, the signal must change within four to six seconds after the flaps are retracted to less than 23° extension.

The next steps involve testing the response of the idle thrust controller to various states of the engine anti-icing system. The first step of this portion of the functional test is a set anti-icing switch message 352 that instructs the technician to set the appropriate engine anti-ice switch. Anti-ice switch message 352 may also include instructions to the technician that circuit breakers should be either opened or closed during specific portions of this test. Following the setting of the anti-ice switch by the technician, a controller test 354 is implemented. With the anti-ice switch on, the results of this test should indicate that the approach idle signal is asserted. The next step is an anti-ice switch off message 355 generated by system controller 110, instructing the technician to turn the anti-ice switch off. A controller test 356 follows the anti-icing switch off message 355 to determine if the controller immediately asserts the minimum idle speed signal, as required.

The response of the approach-minimum idle speed controller to the aircraft landing is then tested. Test application 134 generates a flap extend command 358 whereby FCU 36 broadcasts simulation data indicating that the flaps are extended to a position greater than 23°. A PSEU simulation data broadcast step 360 follows whereby system controller 110 directs PSEU 34 to broadcast simulation data that the landing gear is extended. The receipt of the gear extended simulation data is in turn registered by the idle speed controller that the aircraft 12 is on the ground, i.e., that it has just landed. Immediately following the command to and broadcast of the simulation data is a controller test 362 to determine if the system promptly switches from asserting an approach idle thrust signal to asserting a minimum idle thrust signal. Controller test 362 completes the actual functional testing of the idle thrust controller.

An end simulation data broadcast step 363 follows the last controller test 282. In the end simulation data broadcast, system controller 110 directs the PSEU 34 and FCU 36 to stop broadcasting simulation data and to return control of their central processing units to their operating systems 58.

System controller 110 then generates a set of closure messages 364. Closure messages 364 are instructions that direct the technician to reset any circuit breakers and switches previously positioned to enable the functional testing. Following the resetting of the controls and circuits of the closure messages 364, test application 134 performs an invocation step 365 that returns control of ATE 18 to test executive 128. System controller 110 then generates one or more menus 366 informing the technician of other automated functional tests that can be performed, or offering to return direct control of the ATE 18 and test instruments 76-94 to the technician.

The functional testing process as depicted in FIG. 12 also includes the unloading of the results of the test by the central control unit 22 for archival in the permanent memory 24. This is the store test results step 290 discussed with reference to FIG. 11. Unloading of the test results begins with the connection 368 of the ATE 18 to the central control unit 22 by way of the communications link 74. After ATE 18 and central control unit 22 are interconnected, the test result unloader 260 (FIG. 10) in the central control unit 22 performs an interrogation and read 370. During the interrogation and read 370, test results from test application 134 and any other test applications that are stored in the system control or memory are copied into the central control unit memory 24. After the interrogation and read 370, operating system 126 directs system controller 110 to perform an erase 372 that deletes the just-read test data from memory. Erase 372 thus frees memory space for storage of later run aircraft functional tests.

Each test application 132-144 contains set instructions that automatically perform a functional test on the aircraft as described above for test application 134.

Other test applications may invoke an LRU simulation package to broadcast simulation data as part of the functional test performed by the application.

Some test applications include instructions that direct the system controller 110 to apply stimuli to the aircraft from the ATE 18 and monitor the response to the stimuli in certain conditions. The cockpit thrust levers used by the pilot to control engine thrust are, for example, tested by applying stimuli thereto. The thrust levers operate by sending two AC signals to the EECs 30. One signal has a constant voltage and the second signal has a voltage that varies with the position of the thrust lever. The ATE test application is used to functionally test the thrust lever by initially transmitting two AC signals to the thrust lever from one of the function generators 90 or 92. The test application then instructs the technician to move the thrust lever to various positions. After the lever is moved, the angular position indicator 94 is used to measure the relative voltage of the applied and returned signals. The measured voltages are compared with the desired voltages to determine whether signals that accurately reflect the displacement of the lever have been received.

Other functional tests performed by system controller 110 in response to instructions contained in test applications 132-144 may include one or more steps of reading ARINC words 64 as part of the testing process. For example, some aircraft have a number of ADCs 32 that provide altitude and air speed data over ARINC buses 46. The ADCs 32 may be interconnected such that one ADC serves as a primary ADC that normally supplies information to the EECs 30. When the primary ADC 32 fails, one of the other ADCs 32 starts supplying the information. Functional testing of the ADCs 32 includes verifying that when the primary ADC 32 is deactivated, the appropriate secondary ADC provides air data information to the EEC 30. Functional testing is performed by ATE 18 by establishing a connection between the system controller 110 and the ARINC data bus 46 through the signal interface cable 98 at the point where the EEC is normally connected to the bus. The ARINC transceiver 145 is then used to monitor air data ARINC words 64 to determine the ADC 32 providing the words, i.e., which is the primary ADC. Cockpit controls are then switched to disable the primary ADC 32. The SDI code 66 of air speed and altitude ARINC words 64 are then monitored to verify that the appropriate secondary ADC 32 is broadcasting air data information to the EEC 30.

Some functional tests may alternatively include reading ARINC words 64 that are normally broadcast to the CMC 44. For example, in one aircraft 12, thrust reverse lever interlock control words are broadcast by a thrust controller (not illustrated) to prevent the cockpit crew from accidentally directing the aircraft to apply reverse thrust in certain situations. For example, when the aircraft 12 is in flight, excess reverse thrust should not be applied. A specific thrust reverse interlock control word, when broadcast, triggers an actuator that prevents the cockpit crew from moving the thrust reverse lever beyond a certain point. In aircraft 12, the thrust reverse lever interlock control words are also broadcast to the CMC 44. Functional testing of the thrust controller includes reading the thrust interlock control words broadcast to the CMC 44 to determine that this function of the system is operating correctly.

Integrated aircraft test system 10 of this invention facilitates the functional testing of the components and subsystems that comprise modern aircraft 12. Functional tests can be created, their accuracy checked, scheduled, selected for execution and their results analyzed, all without the transfer of any paper. The test accessor 250 ensures that technicians receive notices of what tests need to be performed after an assembly or manufacturing process is completed. The test auditor 266 ensures that the appropriate warning messages are broadcast in case a functional test is missed or failed.

The ATEs 14-20 of this invention can readily be connected to the aircraft 12 at almost any time during the manufacture or maintenance thereof in order to perform any desired functional test. Functional testing of most components and subsystems of an aircraft can be performed automatically by implementing the required test applications on an ATE that includes the appropriate test instruments. Accordingly, the time and skill level technicians need to perform functional tests is minimized. Since the functional tests are automated, the possibility that technician error may result in either a test being improperly performed, or the results of the tests being improperly recorded, are similarly reduced.

The remote access terminal 21 provides technicians with a complete set of instructions for functional tests that must be manually performed, and a convenient means for recording and storing the test results. The mobile certification cart 28 provides a way to certify the ATE test instruments at their point of use with a minimal amount of effort.

Still another advantage of the integrated aircraft test system 10 is that once each test application is created at a terminal 26 or 27, it can readily be loaded into the appropriate ATEs 14, 16, 18, or 20 through the central control unit 22. This reduces error and misunderstanding associated with transferring functional tests from the personnel who design them to the personnel who perform them and simplifies implementation of changes in the test. Moreover, since the test applications are automated, there is minimal possibility that personnel may forget to perform test steps associated with new or modified test procedures.

Test applications 132-144 of this system 10 are capable of invoking simulation packages 60 on the LRUs 30-42. The ATEs are thus able to direct broadcast simulation data over the ARINC buses 46 as part of any given functional test. This capability further minimizes the amount of technician time the functional tests require, since the need to have a technician manually generate simulation data is eliminated. Since the simulation data is broadcast upon direct command of the test applications 132-142 or 144, the possibility that inaccurate simulation data may be broadcast during functional testing is also eliminated.

The integrated aircraft test system 10 of this invention automatically stores test results of aircraft functional testing, first in the system controller memory 118 as the tests are performed, and then in the central control unit memory 24 for permanent archival. The system 10 thus eliminates basically all expense and error associated with having technicians and others record or transcribe the results of the functional testing. The remote access terminal 29 is useful for providing a technician with instructions for manual testing of the aircraft, and a memory for recording the test results. Moreover, both the certification cart 28 and remote access terminal 21 are designed so that the test data stored therein can be archived in the central control unit memory 23. Thus, this system 10 provides a way to store all the test data associated with a particular aircraft 12, including test instrument certification data, in one central location. Furthermore, the test records are in a format that enable them to be readily transferred, in whole or in part, between the manufacturer and owner of the aircraft, as may be required.

The foregoing description has been limited to a specific embodiment of this invention. It will be apparent, however, that the invention can be practiced in systems having diverse configurations or in systems that use different internal elements than are disclosed in this specification with the attainment of some or all of the advantages described above. For example, the exact number of ATE carts and functions thereof may vary from what is disclosed. Similarly, the number of test instruments on each ATE cart may vary as is required by the specific functional test desired to be performed with the cart. In some ATE carts 14-20 it may be desirable to provide a patch panel in which is a hardwired interconnector that limits the test instrument-to-signal interface cable head pins interconnections that can be established by switch matrix 100. The hardware limitations established by the patch panel prevents interconnections that could damage either the test instruments or the aircraft components. Also, some system controllers 110 may require different instrument tools 158, 164, or simulation tools or drivers 176-180 than those described in the above preferred embodiment. Moreover, in some configurations of the invention, it may be possible to attach an ATE to the aircraft and the central control unit simultaneously. These configurations make it possible at test development sites and test information sites to control in real time the tests performed on the aircraft and/or to monitor test results in real time.

The functional test steps described with respect to tests performed during the execution of test application 134 similarly serves for purposes of illustration only. The specific instructions of any given test application may vary widely from what has been described. It is similarly understood that the described program and memory modules and process steps associated with creating, scheduling, and reviewing the functional tests contained in and performed by the central control unit were exemplary. In other configurations of the invention, the different program modules and process steps may be used to achieve the same ends. For instance, in some versions of the invention used in aircraft maintenance installations, each ATE system controller 110 may have a test accessor and a test schedule memory. When the ATE is attached to the aircraft, the system controller interrogates the central maintenance computer regarding the history of the aircraft. Based on the information provided, for example, the hours and segments the aircraft has flown, the test accessor, by referencing the test schedule memory, determines what functional tests need to be performed on the aircraft. The system controller 110 will then indicate this information on the ATE display touch screen 114. For example, the test applications for some functional tests may include instructions that maintain aircraft component-test instrument interconnections between separate tests. It will be understood that these and other modifications fall within the scope of the appended claims and the claims are not in any way limited by the disclosure of the preferred embodiment of the invention described above.

The embodiments of the invention in which an exclusive property or privilege is claimed are defined as follows:

1. An integrated aircraft test system for functionally testing a plurality of aircraft components and subsystems, wherein at least one of the aircraft components and subsystems operates in response to data broadcast from another one of the aircraft components, and wherein during functional testing of said one of the aircraft components and subsystems, simulation data are broadcast thereto, said test system comprising:

(a) at least two automated test equipment carts for performing functional tests on different aircraft components and subsystems, at least one said cart having instruments for functionally testing the at least one aircraft component and subsystem that operates in response to data broadcast by another of the one of the aircraft components, each of said carts including:

a plurality of processor controllable instruments for performing functional tests on specific aircraft components and subsystems;

connection means for interconnecting said instruments to the components and subsystems that said instruments functionally test; and a system controller connected to said instruments for controlling said instruments and having an input/output unit, said system controller controlling the functional test of said at least one aircraft component and subsystem by said instruments and including means for receiving and storing the results of the functional test from said instruments, said system controller input/output unit of said automated test equipment cart having said instruments for performing functional testing on the at least one aircraft component and subsystem that operates in response to the simulation data broadcast from the another aircraft component further being connected to said connection means so that said system controller can control the broadcast of the simulation data to the at least one aircraft component and subsystem through data transmissions over said connection means; and (b) a central control unit including a memory, said central control unit adapted for connection to said system controller input/output units for reading said stored test results therefrom and for storing said test results in said central control unit memory.

2. The integrated aircraft test system claim 1, wherein each said system controller includes at least two test applications, each said test application comprising a set of system controller-executable instructions directing said system controller to perform a functional test with said instruments associated therewith, said test applications containing instructions directing said system controller to perform different functional tests.

3. The integrated aircraft test system of claim 1, wherein each said automated test equipment cart further includes:

at least one signal interface cable associated with said cart, having a plurality of connector elements for establishing separate conductive links to the aircraft components and subsystems;

a processor controllable switch matrix connected to said test instruments and said signal interface conductive elements for selectively establishing conductive interconnections between said instruments and said signal interface cable conductive elements; and wherein said system controller is connected to said switch matrix and is operative to control said conductive interconnections established thereby during the functional tests.

4. The integrated aircraft test system of claim 2, wherein each automated test equipment cart further includes:

at least one signal interface cable associated with said cart, having a plurality of conductive elements for establishing separate conductive links to the aircraft components and subsystems;

a processor controllable switch matrix connected to said test instruments and said signal interface conductive elements, for selectively establishing conductive interconnections between said instruments and said signal interface cable conductive elements;

said system controller being connected to said switch matrix for controlling said conductive interconnections established thereby; and said test applications further containing instructions directing said system controller to control said switch matrix so that selected electrical interconnections are established during each functional test.

5. The integrated aircraft test system of claim 1, wherein a plurality of aircraft components and subsystems operate in response to data broadcasts by separate aircraft line-replaceable units, and during functional testing of at least two of the aircraft components and subsystems, the simulation data are broadcast thereto by at least one of the line-replaceable units, and wherein:

said connection means associated with said automated test equipment cart having instruments for functionally testing the aircraft components and subsystems to which the simulation data is broadcast configured to interconnect said automated test equipment cart and the aircraft line-replaceable unit; and the input-output unit of said automated test equipment cart is connected to said connection means so that said system controller can control the broadcast of the simulation data to the aircraft line-replaceable unit through data transmission over said connection means.

6. The integrated aircraft test system of claim 5, wherein the line-replaceable unit that broadcasts the simulation data is connected to an on-aircraft central maintenance processor that controls the broadcast of the simulation data; said system further including:

a plurality of said automated test equipment carts for functionally testing the aircraft components and subsystems, which during the functional testing thereof receive the simulation data, each said cart having a central maintenance processor cable for providing a communications link between the central maintenance processor and the associated system controller; and wherein each said system controller is operative to control the broadcast of the simulation data by the line-replaceable unit through data transmission to the central maintenance processor over said central maintenance processor cable.

7. The integrated aircraft test system of claim 6, wherein each said system controller includes at least one test application comprising a set of system controller-executable instructions directing said system controller to perform a functional test with said instruments associated therewith.

8. The integrated aircraft test system of claim 7, wherein each said system controller further includes at least two test applications containing instructions directing said system controller to perform different functional tests, and at least one of said applications on at least one said automated test equipment cart having said instruments for functionally testing the aircraft components and subsystems that operate in response to data broadcast by another aircraft component is a set of instructions for performing a functional test on the aircraft component or subsystem that during the testing thereof receives the simulation data, said test application further containing instructions that direct said automated test equipment cart system controller to operatively control the broadcast of the simulation data during the functional test.

9. The integrated aircraft test system of claim 7, wherein each said automated test equipment cart further includes:

at least one signal interface cable associated with said cart, having a plurality of connector elements for establishing separate conductive links to the aircraft components and subsystems;

a processor-controllable switch matrix for selectively establishing conductive interconnections between said cart instruments and said signal interface cable conductive elements;

said system controller being connected to said switch matrix for controlling said electrical connections established thereby; and wherein said at least one test application further includes instructions that said system controller executes to control said switch matrix so that said electrical connections are established during each said functional test.

10. The integrated aircraft test system of claim 9 further including:

a central control unit including a memory, said central control unit being adapted for connection to said system controllers for reading and storing test results in said central control unit memory.

11. The integrated aircraft test system of claim 4, wherein one said automated test equipment cart includes instruments for testing the components and subsystems associated with a flight controller system on the aircraft, and said test applications associated with said cart direct said system controller associated with said cart to perform flight controller component and subsystem functional tests with said instruments.

12. The integrated aircraft test system of claim 4, wherein one of said automated test equipment carts includes instruments for testing components and subsystems associated with an avionics system on the aircraft, and said test applications associated with said cart direct said system controller associated with said cart to perform functional tests on the components and subsystems of the aircraft avionics system.

13. The integrated aircraft test system of claim 4, wherein one of said automated test equipment carts includes test instruments for performing functional tests on the components and subsystems associated with an engine system on the aircraft, and said test applications associated with said one cart direct said system controller associated with said one cart to perform functional tests on the components and subsystems of the aircraft engine system.

14. The integrated aircraft test system of claim 4, wherein one of said carts includes instruments for functionally testing the components and subsystems associated with a power system on the aircraft, and said test applications associated with said one cart direct said system controller associated with said one cart to perform functional tests on the components and subsystems of the aircraft power system.

15. The integrated aircraft test system of claim 6, wherein one of said automated test equipment carts includes test instruments for functionally testing the components and subsystems associated with a flight controller system on the aircraft, and said test applications associated with said one cart direct said system controller to perform functional tests on the components and subsystems associated with the flight controller system.

16. The integrated aircraft test system of claim 6, wherein one of said automated test equipment carts includes instruments for testing the components and subsystems associated with an avionics system on the aircraft, and said test applications associated with said one cart direct said system controller associated with said one cart to perform functional tests on the components and subsystems associated with the avionics system.

17. The integrated aircraft test system of claim 6, wherein one of said automated test equipment carts includes instruments for performing functional tests on the components and subsystems associated with an engine system on the aircraft, and said test applications associated with said one cart direct said system controller associated with said one cart to perform functional tests on the components and subsystems of the engine system.

18. The integrated aircraft test system of claim 6, wherein one of said automated test equipment carts includes instruments for testing the components and subsystems associated with a power system on the aircraft, and said test applications associated with said one cart direct said system controller associated with said one cart to perform functional tests on the components and subsystems associated with the aircraft power system.

19. An automated test equipment cart for functionally testing a plurality of aircraft components and subsystems, at least one of the aircraft components and subsystems functionally tested while operating in response to simulation data broadcast by another aircraft component, the functional testing of one of the components and subsystems including determination of its response to the simulation data, said cart comprising:
 (a) a portable housing;
 (b) a plurality of processor-controllable instruments disposed on said housing for performing functional tests on the aircraft components and subsystems;
 (c) connection means for interconnecting said instruments to the aircraft components and subsystems; and
 (d) a system controller connected to said cart instruments, and further connected to the aircraft component broadcasting the simulation data, said system controller operative to control the functional test performance of the aircraft components and subsystems by said test instruments and operative to control the broadcast of the simulation data from the aircraft component broadcasting the simulation data, and including means for receiving and storing the results of the functional tests performed by said cart instruments.

20. The automated test equipment cart of claim 19, wherein said system controller further includes at least one test application comprising a set of system controller-executable instructions directing said system controller to perform a functional test with said instruments.

21. The integrated aircraft test system of claim 20, wherein said system controller contains at least two test applications directing said system controller to perform different functional tests.

22. The automated test equipment cart of claim 19 further including:
 at least one display-data entry device connected to said system controller enabling an exchange of data between an operator and said system controller;
 said system controller being adapted to exchange said data with the operator over said display-data entry device and further able to control said instruments in response to commands entered by the operator through said display-data entry device and to display said test results on said display-data entry device.

23. The automated test equipment cart of claim 21 further including:
 at least one display-data entry device connected to said system controller enabling an exchange of data between an operator and said system controller; and
 said system controller being adapted to exchange said data with an operator over said display-data entry device, and further able to control said instruments in response to commands entered by the operator through said display-data entry device and to display said test results on said display-data entry device.

24. The automated test equipment cart of claim 23, wherein at least one of said test applications contains instructions directing said system controller to generate messages on said display-data entry device informing the operator of the operator-performed steps that need to be performed during the functional test.

25. The automated test equipment cart of claim 19, wherein said system controller includes an input/output unit so that a central control unit can be connected thereto for reading said stored test results.

26. The automated test equipment cart of claim 19 further including:
 at least one signal interface cable associated with said cart, having a plurality of connector elements for establishing separate conductive links to the aircraft components and subsystems;
 a processor-controllable switch matrix for selectively establishing conductive interconnections between said instruments and said signal interface cable conductive elements; and
 said system controller being connected to said switch matrix for controlling said electrical connections established thereby during the functional test.

27. The automated test equipment cart of claim 21 further including:
 at least one signal interface cable associated with said cart, having a plurality of connector elements for establishing conductive links to the aircraft components and subsystems;
 a processor-controllable switch matrix for selectively establishing conductive interconnections between said instruments and said signal interface cable conductive elements;

said system controller being connected to said switch matrix for controlling said electrical connections established thereby; and said test application instructions directing said system controller to control said switch matrix so that selected electrical interconnections are established during each said functional test.

28. The automated test equipment cart of claim 19, wherein a plurality of aircraft components and subsystems operate in response to data broadcast by separate aircraft line-replaceable units, and during the functional testing of at least one of the aircraft components and subsystems, the simulation data is broadcast thereto by at least one line-replaceable unit; said cart further including:

connection means for establishing interconnections between said system controller and the aircraft line-replaceable units; and said system controller having an input/output unit so that said connection means can be connected thereto and being operative to control the broadcast of the simulation data by the aircraft line-replaceable units through signals transmitted over said connection means during the functional testing.

29. The automated test equipment carts of claim 28, wherein the line-replaceable units that broadcast the simulation data are connected to an on-aircraft central maintenance processor that controls the broadcast of the simulation data, said cart further including:

a central maintenance processor cable for providing a signal communications link between the central maintenance processor and said system controller;

said system controller being operative to control the broadcast of the simulation data from the line-replaceable units by the transmission of control signals to the central maintenance processor.

30. The automated test equipment cart of claim 29, wherein said system controller contains a plurality of test applications, each said test application comprising a set of system controller-executable instructions directing said system controller to perform a different functional test with said instruments, at least one said test application containing instructions to perform functional tests on an aircraft component or subsystem that, during the testing thereof, causes the simulation data to be broadcast to the aircraft component or subsystem, said at least one test application containing instructions directing said system controller to transmit control signals to the central maintenance processor to invoke the broadcast of the simulation data.

31. An integrated aircraft test system for functionally testing a plurality of aircraft components and subsystems, said test system comprising:

(a) a central control unit with memory means for storing a plurality of test applications used for performing functional tests on specific aircraft components and subsystems, at least two of said test applications comprising instructions for performing functional tests on different aircraft components and subsystems, for storing test results of functional tests performed on the aircraft, and for storing an indication of which said functional tests should be performed on the aircraft after particular work processes are performed;

(b) a test access station connected to said central control unit having input/output means for entering into said central control unit an indication of work processes performed on the aircraft wherein said central control unit responds to said indication of work processes performed on the aircraft by generating a message on said test access station input/output means indicating the functional tests that need to be performed on the aircraft in response to the work processes performed thereon; and (c) a plurality of portable automated test equipment carts, each cart having instruments for performing functional tests on the aircraft in response to said test applications, at least two of said carts having instruments for performing functional tests on different aircraft components and subsystems, said carts each further having means for storing said test applications and test results of functional tests performed on the aircraft, and connection means for electronically connecting each said cart to said central control unit so that said test applications can be loaded from said central control unit to each said cart and so that said test results can be loaded from each said cart to said central control unit.

32. The integrated aircraft test system of claim 31, wherein:

said central control unit memory means are further operative to store a plurality of instruction sets of functional tests manually performed on the aircraft, further comprising;

a portable remote access terminal for storing said instruction sets and said test results;

display means for displaying instructional information regarding functional tests performed on the aircraft in response to said stored instruction sets;

data entry means for manually entering said test results of functional tests performed on the aircraft; and connection means for electronically connecting said remote access terminal to said central control unit so that said instruction sets can be loaded from said central control unit to said remote access terminal and so that said test results can be loaded from said remote access terminal to said central control unit.

33. The integrated aircraft test system of claim 31, wherein said central control unit further responds to said indication of work performed by loading selected test applications for said functional tests to be performed on the aircraft into said automated test equipment carts used to perform said functional tests.

34. The integrated test access system of claim 31, wherein said central control unit includes a test auditor means for reviewing said test results and said work processes performed on the aircraft stored in said central control unit memory means and, wherein in response to said review, said test auditor means generates messages indicating missed and failed functional tests.

35. The integrated aircraft test system of claim 31, further including:

a test development site connected to said central control unit, having input/output means for entering said test applications, and for reviewing and certifying said test applications; and wherein said central control unit stores each newly entered test application and loads said test applications into said automated test equipment carts and remote access terminal only after each said newly entered test application is certified.

36. An integrated aircraft test system for functionally testing a plurality of aircraft components and subsystems, said test system comprising:
  (a) a central control unit with memory means for storing: a plurality of test applications used for performing functional tests on specific aircraft components and subsystems, at least two of said test applications comprising instructions for performing functional tests on different aircraft components and subsystems; instruction sets of functional tests manually performed on the aircraft; test results of said functional tests performed on the aircraft; and, an indication of which said functional tests should be performed on the aircraft after particular work processes are performed;
  (b) a test access station connected to said central control unit having input/output means for entering into said central control unit an indication of work processes performed on the aircraft wherein said central control unit responds to said indication of work processes performed on the aircraft by generating a message on said test access station input/output means indicating the functional tests that need to be performed on the aircraft in response to the work processes performed thereon;
  (c) a plurality of portable automated test equipment carts, each cart having instruments for performing functional tests on the aircraft in response to said test applications, at least two of said carts having instruments for performing functional tests on different aircraft components and subsystems, said carts each further having means for storing said test applications and test results of functional tests performed on the aircraft, and connection means for electronically connecting each said cart to said central control unit so that said test applications can be loaded from said central control unit to each said cart and so that said test results can be loaded from each said cart to said central control unit; and
  (d) a portable remote access terminal comprising: memory means for storing said instruction sets and said test results; display means for displaying instructional information regarding functional tests performed on the aircraft in response to said stored instruction sets; data entry means for manually entering said test results of functional tests performed on the aircraft; and, connection means for electronically connecting said remote access terminal to said central control unit so that said instruction sets can be loaded from said central control unit to said remote access terminal and so that said test results can be loaded from said remote access terminal to said central control unit.

37. The integrated aircraft system of claim 36, wherein said central control unit further responds to said indication of work performed by loading selected test applications and instruction sets comprising instructions for said functional tests to be performed on the aircraft into said automated test equipment carts and into said remote access terminal.

38. The integrated aircraft test system of claim 36, wherein said central control unit includes test auditor means for reviewing said test results stored in said central control unit memory means and said work processes performed on on the aircraft, and, wherein in response to said review, said test auditor means are operative to generate messages indicating missed and failed functional tests.

39. The integrated aircraft test system of claim 36, further including:
  a test development site connected to said central control unit, having input/output means for entering said test applications and said instructions sets and for reviewing and certifying said test applications and said instruction sets; and
  wherein said central control unit stores each newly entered test application and instruction set and loads said test applications and said instruction sets into said automated test equipment carts and said remote access terminal only after each said newly entered test application or instruction set is certified.

* * * * *

UNITED STATES PATENT AND TRADEMARK OFFICE
CERTIFICATE OF CORRECTION

PATENT NO. : 5,111,402
DATED : May 5, 1992
INVENTOR(S) : D. K. Brooks et al.

It is certified that error appears in the above-identified patent and that said Letters Patent is hereby corrected as shown below:

| COLUMN | LINE | |
|---|---|---|
| [57], Abstract | 21 | "application" should read --applications-- |
| [57], Abstract | 27 | "selectiively" should read --selectively-- |
| [57], Abstract | 29 | delete "results" (second occurrence) |
| [57], Abstract | 30 | "archieved" should read --archived-- |
| 2 | 57 | "other" should read --others-- |
| 4 | 63 | "test" should read --tests-- |
| 9 | 27 | "insured" should read --insure-- |
| 11 | 48 | "word" should read --words-- |
| 12 | 60 | "annuciators" should read --annunciators-- |
| 34 | 24 | delete "on" (second occurrence) |
| (Claim 38, | Line 5) | |

Signed and Sealed this

Twenty-first Day of September, 1993

Attest:

BRUCE LEHMAN

*Attesting Officer*          *Commissioner of Patents and Trademarks*